United States Patent
Jones et al.

(10) Patent No.: US 10,075,132 B2
(45) Date of Patent: Sep. 11, 2018

(54) RF AMPLIFIER WITH CONDUCTOR-LESS REGION UNDERLYING FILTER CIRCUIT INDUCTOR, AND METHODS OF MANUFACTURE THEREOF

(71) Applicant: FREESCALE SEMICONDUCTOR, INC., Austin, TX (US)

(72) Inventors: Jeffrey K. Jones, Chandler, AZ (US); David F. Abdo, Scottsdale, AZ (US); Basim H. Noori, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 35 days.

(21) Appl. No.: 14/666,999

(22) Filed: Mar. 24, 2015

(65) Prior Publication Data
US 2016/0285418 A1    Sep. 29, 2016

(51) Int. Cl.
H03F 1/02 (2006.01)
H03F 1/56 (2006.01)
(Continued)

(52) U.S. Cl.
CPC ......... H03F 1/0205 (2013.01); H01L 21/561 (2013.01); H01L 21/78 (2013.01);
(Continued)

(58) Field of Classification Search
CPC ....................................................... H03F 1/02
(Continued)

(56) References Cited

U.S. PATENT DOCUMENTS 5,177,669 A   1/1993   Juskey et al.
5,371,404 A   12/1994  Juskey et al.
(Continued)

FOREIGN PATENT DOCUMENTS

CN   103824755 A    5/2014
EP     1513170 A2    3/2005
(Continued)

OTHER PUBLICATIONS

Chang, J.Y.C et al., "Large Suspended Inductors on Silicon and Their Use in a 2-um CMOS RF Amplifier," IEEE Electron Device Letters; vol. 14; No. 5; May 1993; pp. 246-248.
(Continued)

Primary Examiner — Patricia T Nguyen
(74) Attorney, Agent, or Firm — Sherry W. Schumm

(57) ABSTRACT

An amplifier includes a semiconductor substrate. A first conductive feature partially covers the bottom substrate surface to define a conductor-less region of the bottom substrate surface. A first current conducting terminal of a transistor is electrically coupled to the first conductive feature. Second and third conductive features may be coupled to other regions of the bottom substrate surface. A first filter circuit includes an inductor formed over a portion of the top substrate surface that is directly opposite the conductor-less region. The first filter circuit may be electrically coupled between a second current conducting terminal of the transistor and the second conductive feature. A second filter circuit may be electrically coupled between a control terminal of the transistor and the third conductive feature. Conductive leads may be coupled to the second and third conductive features, or the second and third conductive features may be coupled to a printed circuit board.

33 Claims, 11 Drawing Sheets

(51) Int. Cl.
*H03F 3/195* (2006.01)
*H03F 3/21* (2006.01)
*H03F 3/213* (2006.01)
*H01L 21/56* (2006.01)
*H01L 21/78* (2006.01)
*H01L 23/31* (2006.01)
*H01L 23/495* (2006.01)
*H01L 23/522* (2006.01)
*H01L 23/00* (2006.01)
*H01L 49/02* (2006.01)
*H03F 3/193* (2006.01)

(52) U.S. Cl.
CPC .... *H01L 23/3107* (2013.01); *H01L 23/49531* (2013.01); *H01L 23/49562* (2013.01); *H01L 23/5227* (2013.01); *H01L 24/97* (2013.01); *H01L 28/10* (2013.01); *H03F 1/0288* (2013.01); *H03F 1/565* (2013.01); *H03F 3/193* (2013.01); *H03F 3/195* (2013.01); *H03F 3/211* (2013.01); *H03F 3/213* (2013.01); *H03F 2200/108* (2013.01); *H03F 2200/165* (2013.01); *H03F 2200/171* (2013.01); *H03F 2200/181* (2013.01); *H03F 2200/216* (2013.01); *H03F 2200/222* (2013.01); *H03F 2200/225* (2013.01); *H03F 2200/297* (2013.01); *H03F 2200/301* (2013.01); *H03F 2200/391* (2013.01); *H03F 2200/42* (2013.01); *H03F 2200/432* (2013.01); *H03F 2200/451* (2013.01); *H03F 2200/48* (2013.01); *H03F 2200/75* (2013.01); *H03F 2203/21103* (2013.01); *H03F 2203/21106* (2013.01); *H03F 2203/21112* (2013.01); *H03F 2203/21139* (2013.01); *H03F 2203/21142* (2013.01); *H03F 2203/21157* (2013.01)

(58) Field of Classification Search
USPC .......................... 330/310, 250, 307; 257/277
See application file for complete search history.

(56) References Cited

U.S. PATENT DOCUMENTS

| | | | |
|---|---|---|---|
| 5,614,743 | A | 3/1997 | Mochizuki |
| 5,776,798 | A | 7/1998 | Quan et al. |
| 6,057,175 | A | 5/2000 | Milla et al. |
| 6,228,676 | B1 | 5/2001 | Glenn et al. |
| 6,287,931 | B1 | 9/2001 | Chen |
| 6,310,386 | B1 | 10/2001 | Shenoy |
| 6,455,393 | B1 | 9/2002 | Swanson |
| 6,611,002 | B2 | 8/2003 | Weeks et al. |
| 6,727,778 | B2 | 4/2004 | Kudrle et al. |
| 6,759,275 | B1 | 7/2004 | Lee et al. |
| 6,806,552 | B2 | 10/2004 | Woo et al. |
| 7,118,988 | B2 | 10/2006 | Buerger, Jr. et al. |
| 7,255,001 | B1 | 8/2007 | Davis et al. |
| 7,452,806 | B2 | 11/2008 | Hwang et al. |
| 7,723,224 | B2 | 5/2010 | Hill et al. |
| 7,795,126 | B2 | 9/2010 | Prabhu et al. |
| 7,808,798 | B2 | 10/2010 | Cotte et al. |
| 7,973,629 | B2 | 7/2011 | Lin et al. |
| 8,013,437 | B1 | 9/2011 | Sirinorakul et al. |
| 8,304,271 | B2 | 11/2012 | Huang et al. |
| 8,324,692 | B2 | 12/2012 | Chen et al. |
| 2004/0080028 | A1 | 4/2004 | Yanagisawa |
| 2005/0269668 | A1 | 12/2005 | Zhang |
| 2005/0287707 | A1 | 12/2005 | Lin et al. |
| 2006/0181385 | A1 | 8/2006 | Hurley |
| 2008/0042236 | A1 | 2/2008 | Seah |
| 2008/0096325 | A1 | 4/2008 | Kao et al. |
| 2009/0146245 | A1 | 6/2009 | Tischler |
| 2009/0230537 | A1 | 9/2009 | Liu et al. |
| 2009/0267218 | A1 | 10/2009 | Gupta et al. |
| 2010/0065950 | A1 | 3/2010 | Lowry et al. |
| 2010/0248676 | A1 | 9/2010 | Takahashi |
| 2010/0279470 | A1 | 11/2010 | Grey |
| 2010/0283130 | A1 | 11/2010 | Nishio et al. |
| 2010/0295100 | A1 | 11/2010 | Huang et al. |
| 2010/0327432 | A1 | 12/2010 | Sirinorakul et al. |
| 2011/0254165 | A1 | 10/2011 | Muranaka |
| 2012/0037969 | A1 | 2/2012 | Sanders et al. |
| 2012/0112661 | A1 | 5/2012 | Van De Ven et al. |
| 2012/0273873 | A1 | 11/2012 | Grey |
| 2012/0292757 | A1 | 11/2012 | Mauder et al. |
| 2013/0037917 | A1 | 2/2013 | Xue |
| 2013/0292849 | A1 | 11/2013 | Lin et al. |
| 2014/0209926 | A1 | 7/2014 | Takatani et al. |
| 2014/0287703 | A1 | 9/2014 | Herbsommer et al. |
| 2014/0332980 | A1 | 11/2014 | Sanders et al. |
| 2015/0097200 | A1 | 4/2015 | Bergmann et al. |

FOREIGN PATENT DOCUMENTS

| | | |
|---|---|---|
| JP | 57-107063 A | 7/1982 |
| JP | 11274412 A | 10/1999 |
| JP | 2000040789 A | 2/2000 |
| JP | 2000 349088 A | 12/2000 |
| JP | 2008-141140 A | 6/2008 |

OTHER PUBLICATIONS

Hill, D. et al., "Three-Dimensional MMIC Architecture Using Low Thermal Impedance Technology," IEEE MTT-S International Microwave Symposium Digest; vol. 2; Jun. 7-12, 1998, pp. 699-702.
Notice of Allowance mailed Jun. 15, 2016 for U.S. Appl. No. 14/832,525, 6 pages.
Non-Final Rejection mailed Jun. 9, 2016 for U.S. Appl. No. 14/862,944, 11 pages.
Requirement for Restriction mailed Apr. 21, 2016 for U.S. Appl. No. 14/719,999, 7 pages.
Robertson et al, "Micromachined W-Band Filters", IEEE Transactions on Microwave Theory and Techniques, Apr. 1996, pp. 598-606, vol. 44.
Lee, "A >400 GHz f max Transferred-Substrate Heterojunction Bipolar Transistor IC Technology", IEEE Electron Device Letters, Mar. 1998, pp. 77-79, vol. 19, No. 3.
Campbell, "A Wideband Power Amplifier MMIC Utilizing GaN on SiC HEMT Technology", IEEE Journal of Solid State Circuits, Oct. 2009, pp. 2640-2647, vol. 44, No. 10.
Mensa, "Baseband Amplifiers in Transferred-Substrate HBT Technology", Gallium Arsenide Integrated Circuit (GaAsIC) Symposium Technical Digest, Nov. 1-4, 1998, pp. 33-36, Atlanta, GA.
Chavez et al, Novel Suspended-Line Microstrip Coupler Using BCB as Supporting Layer, Microwave and Optical Technology Letters, Aug. 8, 2007, pp. 1813-1814, vol. 49, No. 8.
Costanzo et al, "Millimeter-Waves Structures on Benzocyclobutene Dielectric Substrate", Radioengineering, Dec. 2011, pp. 785-789, vol. 20, No. 4.
Korndorfer et al, "Simulation and Measurement of Back Side Etched Inductors", Proceedings of the 5th European Microwave Integrated Circuits Conference, 2010, pp. 389-392.
Extended European Search Report for Patent Appln. No. 16162063.8 (Aug. 19, 2016).
Giry, A. et al. "A monolithic watt-level SOI LDMOS linear power amplifier with through silicon via for 4G cellular applications", IEEE Topical Conference on Power Amplifiers for Wireless and Radio Applications (PAWR),19-21 pgs. (2013).
Liao, H. Y. et al. "RF Model and Verification of Through-Silicon Vias in Fully Integrated SiGe Power Amplifier", IEEE Electron Device Letters, vol. 32, No. 6, 809-811 pgs, (Jun. 2011).
Tsay J. et al. "A differential SiGe power amplifier using through-silicon-via and envelope-tracking for broadband wireless applications", IEEE Bipolar/BiCMOS Circuits and Technology Meeting (BCTM), 147-150 pgs. (2014).

(56) References Cited

OTHER PUBLICATIONS

Wu, R. "High-Efficiency Silicon-Based Envelope-Tracking Power Amplifier Design With Envelope Shaping for Broadband Wireless Applications", IEEE Journal of Solid-State Circuits, vol. 48, No. 9, 2030-2040 pgs. (Sep. 2013).
Joseph, A. J. et al. "Through-silicon vias enable next-generation SiGe power amplifiers for wireless communications", IBM Journal of Research and Development, vol. 52, No. 6, 635-648 pgs. (Nov. 2008).
Chen J. et al. "On-Chip Spiral Inductors for RF Applications: An Overview", Journal of Semiconductor Technology and Science, vol. 4, No. 3, 149-167 pgs (Sep. 2004).
Non-Final Office Action mailed Sep. 12, 2016 for U.S. Appl. No. 14/719,999 13 pages.
Requirement for Restriction mailed Apr. 14, 2016 for U.S. Appl. No. 14/862,944, 7 pages.
Yue, C.P. et al. "On-chip spiral inductors with patterned ground shields for Si-based RF Ics", IEEE Journal of Solid-State Circuits, vol. 33, No. 5, pp. 743-752 (May 1998).
Extended European Search Report for Patent Appln. No. 16182864.5 (Jan. 19, 2017).
Notice of Allowance mailed Nov. 14, 2016 for U.S. Appl. No. 14/862,944, 12 pages.
Notice of Allowance mailed Aug. 12, 2016 for U.S. Appl. No. 14/832,525, 7 pages.
Final Rejection mailed Feb. 14, 2017 for U.S. Appl. No. 14/832,525, 14 pages.
Notice of Allowance dated Apr. 25, 2017 for U.S. Appl. No. 14/862,944 5 pages.
Final Office Action dated Feb. 14, 2017 for U.S. Appl. No. 14/719,999 14 pages.
Notice of Allowance dated Sep. 12, 2017 for U.S. Appl. No. 14/719,999 9 pages.
Notice of Allowance dated Aug. 1, 2017 for U.S. Appl. No. 14/862,944 6 pages.

US 10,075,132 B2

RF AMPLIFIER WITH CONDUCTOR-LESS REGION UNDERLYING FILTER CIRCUIT INDUCTOR, AND METHODS OF MANUFACTURE THEREOF

TECHNICAL FIELD

Embodiments of the subject matter described herein relate generally to radio frequency (RF) amplifiers, and more particularly to RF amplifiers that include impedance matching circuits.

BACKGROUND

A typical high power, radio frequency (RF) semiconductor device may include one or more input leads, one or more output leads, one or more transistors, wirebond arrays coupling the input lead(s) to the transistor(s), and wirebond arrays coupling the transistor(s) to the output lead(s). The wirebond arrays have significant inductances at high frequencies, and such inductances may be factored into the design of input and output circuits for a device (e.g., impedance matching circuits).

In some cases, input and output circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead. Each of the input and output circuits may include one or more capacitive elements, along with the inductances inherent in the wirebond arrays interconnecting the capacitive elements with the device's transistor(s) and with the input and output leads.

Wirebond arrays may be designed to function as inductors with relatively high Q (quality) factors, which is desirable to achieve high efficiency amplifiers. However, wirebond arrays often lead to undesirable inductive coupling between various device components. Further, the inclusion of such wirebond arrays in RF devices mandates the use of relatively complex back-end assembly processes using expensive equipment that is not commonly used in the semiconductor industry. For example, the wirebond array attachment equipment must be configured to accurately shape and space each wirebond in order to achieve desired inductances. The inductive coupling characteristics and back-end assembly costs associated with the inclusion of wirebond arrays in RF amplifier devices detrimentally affects device performance and cost.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include amplifiers with high-Q impedance matching circuit inductors that are not implemented using wirebond arrays. Further, embodiments of the inventive subject matter include amplifiers implemented on semiconductor substrates with patterned back metal, where physically separated portions of the back metal may provide distinct input, output, and ground ports, among other things. As will be illuminated below, the various embodiments may enable a significant reduction or complete elimination of wirebond arrays in an RF amplifier device while achieving high efficiency. This may lead to significantly reduced manufacturing costs and higher levels of integration than are achievable using conventional RF amplifier designs and fabrication techniques.

Figure 1:
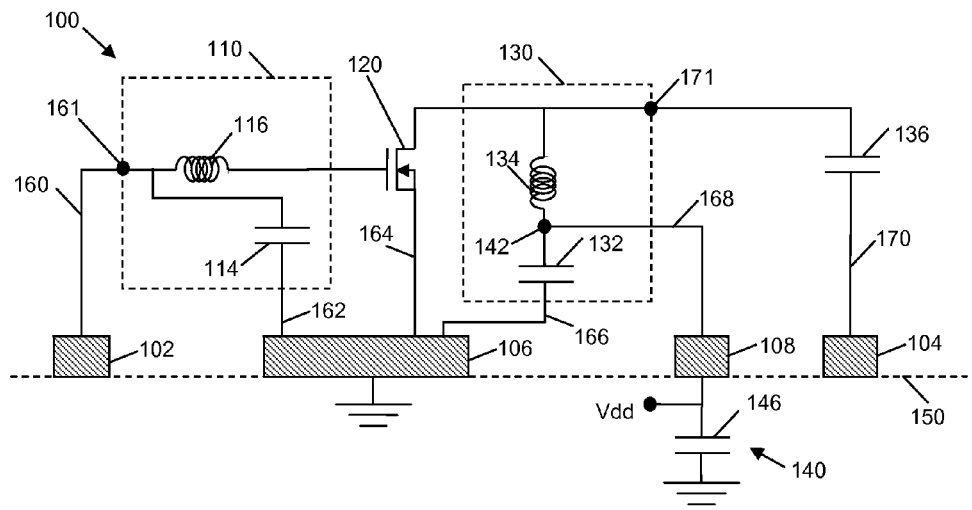
FIG. 1 is a schematic diagram of an RF amplifier with input and output circuits, in accordance with an example embodiment.

FIG. 1 is a schematic diagram of an RF amplifier device 100. Device 100 includes an input terminal 102, an output terminal 104, one or more voltage reference terminals 106 (only one of which is shown in FIG. 1), a radio frequency (RF) cold point terminal 108, an input circuit 110, a transistor 120, and an output circuit 130, in an embodiment. Although transistor 120 and various elements of the input and output circuits 110, 130 are shown as singular components, the depiction is for the purpose of ease of explanation only. Those of skill in the art would understand, based on the description herein, that transistor 120 and/or certain elements of the input and output circuits 110, 130 each may be implemented as multiple components (e.g., connected in parallel or in series with each other). The description of transistor 120 and various elements of the input and output circuits 110, 130, below, are not intended to limit the scope of the inventive subject matter only to the illustrated embodiments.

Transistor 120 is the primary active component of device 100. Transistor 120 includes a control terminal and first and second current conducting terminals, where the current conducting terminals are spatially and electrically separated by a variable-conductivity channel. For example, transistor 120 may be a field effect transistor (FET) (such as a metal oxide semiconductor FET (MOSFET), a laterally diffused MOSFET (LDMOS FET), a high electron mobility transistor (HEMT), and so on), which includes a gate (control terminal), a source (a first current conducting terminal), and a drain (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively).

According to an embodiment, and using nomenclature typically applied to MOSFETs in a non-limiting manner, the gate of transistor 120 is coupled through the input circuit 110 to the input terminal 102, the drain of transistor 120 is coupled through the output circuit 130 to the output terminal 104, and the source of transistor 120 is coupled through the voltage reference terminal 106 to ground (or another voltage reference). More specifically, the gate of transistor 120 may be coupled to the input terminal 102 through one or more conductive structures 160 (e.g., conductive vias or other structures), the source of transistor 120 may be coupled to voltage reference terminal 106 (e.g., a terminal coupled to ground or another voltage reference) through one or more other conductive structures 164 (e.g., conductive vias, a heavily doped sinker region, and so on), and the drain of transistor 120 may be coupled to output terminal 104 through one or more other conductive structures 170 (e.g., conductive vias or other structures). According to an embodiment, a DC blocking capacitor 136 may be coupled between the drain of transistor 120 and the output terminal 104, as illustrated, or the DC blocking capacitor 136 may be excluded, in other embodiments. The value of the DC blocking capacitor 136 may be selected to provide significant gain reductions at low frequencies (e.g., frequencies below the intended RF operating band).

Through the variation of control signals (e.g., input RF signals) provided to the gate of transistor 120, the current between the current conducting terminals of transistor 120 is modulated. For example, when incorporated into an amplifier system (e.g., Doherty amplifier system 1800, FIG. 18), input terminal 102 functions to receive a relatively low-power, input RF signal for amplification. The input RF signal received through input terminal 102 is amplified through transistor 120, and the resultant amplified RF signal is output through output terminal 104.

The input RF signal is conveyed from the input terminal 102 through the input circuit 110 to the control terminal of transistor 120. Input circuit 110, which functions to filter the input RF signal, is coupled between the input terminal 102 and the control terminal of transistor 120. According to an embodiment, input circuit 110 is an input impedance matching circuit, which is configured to raise the impedance of device 100 to a higher (e.g., intermediate or higher) impedance level (e.g., in a range from about 2 to about 10 Ohms or higher). Input circuit 110 is coupled to the input terminal 102 through the conductive structure(s) 160. Further, input circuit 110 may be coupled through one or more additional conductive structures 162 to voltage reference terminal 106 (or another distinct voltage reference terminal).

According to an embodiment, input circuit 110 includes an inductive element 116 and a shunt capacitor 114. More specifically, a first plate (or terminal) of shunt capacitor 114 is electrically coupled to the input terminal 102 (e.g., through conductive structure(s) 160), and a second plate (or terminal) of shunt capacitor 114 is electrically coupled to the voltage reference terminal 106 (e.g., through conductive structure(s) 162). Inductive element 116 has a first terminal that also is electrically coupled to the input terminal 102 (e.g., through conductive structure(s) 160) and to the first plate of shunt capacitor 114, and a second terminal that is electrically coupled to the control terminal of transistor 120. According to an embodiment, the inductive element 116 may have a value in a range between about 50 picohenries (pH) to about 3 nanohenries (nH), and shunt capacitor 114 may have a value in a range between about 5 picofarads (pF) to about 80 pF, although inductive element 116 and shunt capacitor 114 may have values that fall outside of these ranges, as well. In this configuration, input circuit 110 operates as a low pass filter circuit. In alternate embodiments, input circuit 110 may be configured as a high pass filter circuit (e.g., as in the embodiment of FIG. 2) or as a bandpass filter circuit (e.g., as in the embodiment of FIG. 3).

Output circuit 130, which functions to filter the amplified RF signal, is coupled between the drain terminal of transistor 120 and the output terminal 104. According to an embodiment, output circuit 130 is an output impedance matching circuit, which is configured to match the output impedance of device 100 with the input impedance of an external circuit or component (not shown) that may be coupled to output terminal 104 (e.g., 50 Ohms or some other value). Output circuit 130 is coupled to the drain of transistor 120 and to output terminal 104 through one or more conductive structures 170 (e.g., conductive vias or other structures). In addition, output circuit 130 may be coupled through one or more additional conductive structures 166 to voltage reference terminal 106 (or another distinct voltage reference terminal). Further, according to an embodiment, output circuit 130 also may be coupled through one or more additional conductive structures 168 and RF cold point terminal 108 to other external circuitry (described below).

According to an embodiment, output circuit 130 includes a shunt inductive element 134 and a shunt capacitor 132 coupled in series. More specifically, inductive element 134 has a first terminal that is electrically coupled to the drain of transistor 120, and also to output terminal 104 (e.g., through conductive structure(s) 170). Inductive element 134 has a second terminal that is coupled to a first plate (or terminal) of shunt capacitor 132. A second plate (or terminal) of shunt capacitor 132 is electrically coupled to the voltage reference terminal 106 (or another distinct voltage reference terminal) through conductive structure(s) 166. According to an embodiment shunt inductor 134 may have a value in a range between about 100 pH to about 3 nH, and shunt capacitor 132 may have a value in a range between about 50 pF to about 500 pF, although these components may have values outside of these ranges, as well. In this configuration, output circuit 130 operates as a high pass filter circuit. In alternate embodiments, output circuit 130 may be configured as a low pass filter circuit (e.g., as in the embodiment of FIG. 2) or as a bandpass filter circuit (e.g., as in the embodiment of FIG. 3). In an exemplary embodiment, the output circuitry 130 provides a single phase inversion (e.g., a 90° phase shift) that results in the phase of the signal at the output terminal 104 being shifted 90° relative to the signal at the drain of transistor 120.

In an exemplary embodiment, an RF "cold point" is present at the node 142 between shunt inductor 134 and shunt capacitor 132. Accordingly, node 142 may be referred to herein as an "RF cold point node." More specifically, the capacitance of the shunt capacitor 132 is chosen to provide a virtual ground reference voltage for the RF electrical signals at node 142, such that inductive element 134 functions as a shunt inductance to the RF ground voltage, while the inductance of the inductive element 134 is chosen to provide desired impedance at the output terminal 104 at the fundamental frequency of the amplifier 100. For example, for a fundamental frequency in the range of about 1.8 gigahertz (GHz) to about 2.2 GHz with a transistor 120 with a power handling capability within the range of about 50 watts (W) to about 500 W, the capacitance of capacitor 132 may be chosen to be within the range of about 70 pF to about 500 pF, the inductance of the inductive element 124 may be chosen to be within the range of about 100 pH to about 500 pH, such that the output circuit 130 provides an output impedance at the output terminal 104 within the range of about 1.0 to 5.0 Ohms. It should be appreciated that the desired output impedance at the output terminal 104 may be an intermediate impedance that is subsequently transformed to a different value for impedance matching at the input of a power combiner (e.g., power combiner 1860, FIG. 18), and thus, the output impedance at the output terminal 104 will vary to suit the needs of a particular implementation.

Through one or more additional conductive structures 168 (e.g., conductive vias) and RF cold point node terminal 108, the RF cold point node 142 may be coupled to an external circuit. For example, the external circuit may include a voltage source, Vdd, and an envelope frequency termination circuit 140. The voltage source Vdd may be used to bias the transistor 120, and the envelope frequency termination circuit 140 may function to improve the low frequency resonance of device 100 caused by the interaction between the output circuit 130 and bias feeds (not shown) by presenting a high impedance at RF frequencies. In an embodiment in which DC blocking capacitor 136 is excluded, Vdd alternatively may be provided at output terminal 104. The envelope frequency termination circuit 140 essentially is "invisible" from a matching standpoint, as it only effects the output impedance at envelope frequencies (i.e., envelope frequency termination circuit 140 provides terminations for the envelope frequencies of device 100).

According to an embodiment, envelope frequency termination circuit 140 includes a capacitor 146, which may be referred to herein as an "envelope capacitor." A first plate (or terminal) of envelope capacitor 146 is coupled to RF cold point terminal 108, and a second plate (or terminal) of the envelope capacitor 146 is coupled to ground (or another voltage reference), in an embodiment. Envelope capacitor 146 may be a discrete component, for example, and may have a value in a range between about 2.0 nanofarads (nF) to about 1.0 microfarad (g), although envelope capacitor 146 may have a value outside of this range, as well. According to an embodiment, envelope capacitor 146 may be coupled through relatively low-inductance connections to a printed circuit board (PCB) to which device 100 is coupled.

Figure 4:
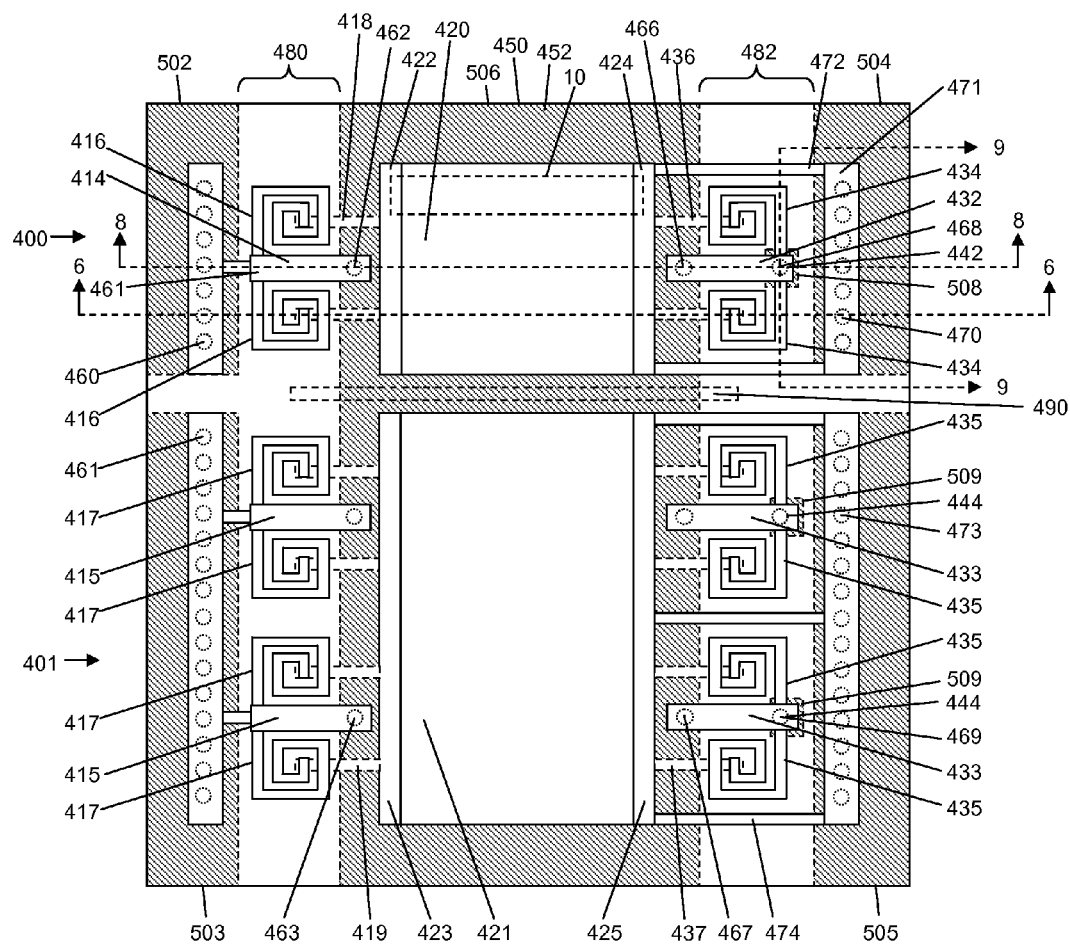
FIG. 4 is a top view of a portion of a semiconductor die, which includes portions of two amplifier paths, in accordance with an example embodiment, in accordance with an example embodiment.

According to an embodiment, input circuit 110, transistor 120, and output circuit 130 all are implemented on a single semiconductor die (e.g., die 450, FIG. 4). In other words, the RF amplifier device 100 is monolithic. In alternate embodiments, portions of input circuit 110 and/or output circuit 130 may be implemented as discrete components, and/or may be implemented on semiconductor die that are distinct from the semiconductor die on which transistor 120 is implemented. Although the Figures and description focus on a monolithic implementation, those of skill in the art would understand, based on the description herein, how various modifications may be made for a non-monolithic implementation (i.e., an implementation in which some components of the input and/or output circuits are included on die other than the transistor die).

According to an embodiment in which input circuit 110, transistor 120, and output circuit 130 are implemented on a single semiconductor substrate, these circuit components may be formed in proximity to (e.g., below, at, and above) a top surface of the substrate. Conversely, some or all of input terminal 102, output terminal 104, voltage reference terminal 106, and RF cold point terminal 108 each may include a conductive feature coupled to a bottom surface of the substrate, in an embodiment. When coupled to the bottom substrate surface, terminals 102, 104, 106, 108 are physically separated from each other across "conductor-less" regions of the bottom substrate surface (i.e., portions of the bottom substrate surface to which no conductive material is coupled). In any event, terminals 102, 104, 106, 108 enable the RF amplifier device 100 to be electrically coupled with external circuitry.

For example, the RF amplifier device 100 may be physically and electrically coupled to a PCB or other substrate (e.g., PCB 1610, FIG. 16), which includes additional circuitry of the amplifier system. In this configuration, a device plane (represented by dashed line 150) is established, where amplifier components present on one side of the device plane (e.g., components above line 150 in FIG. 1, or "above the device plane") may be implemented on a single semiconductor substrate, and components present on the other side of the device plane (e.g., components below line 150 in FIG. 1, or "below the device plane") may be coupled to the PCB or other substrates. For example, and as will be described in more detail later, ground references, voltage references (e.g., Vdd), other components (e.g., capacitor 146), transmission lines, signal splitters, signal combiners, phase shifters, and various other amplifier components may be implemented below the device plane.

Figure 2:
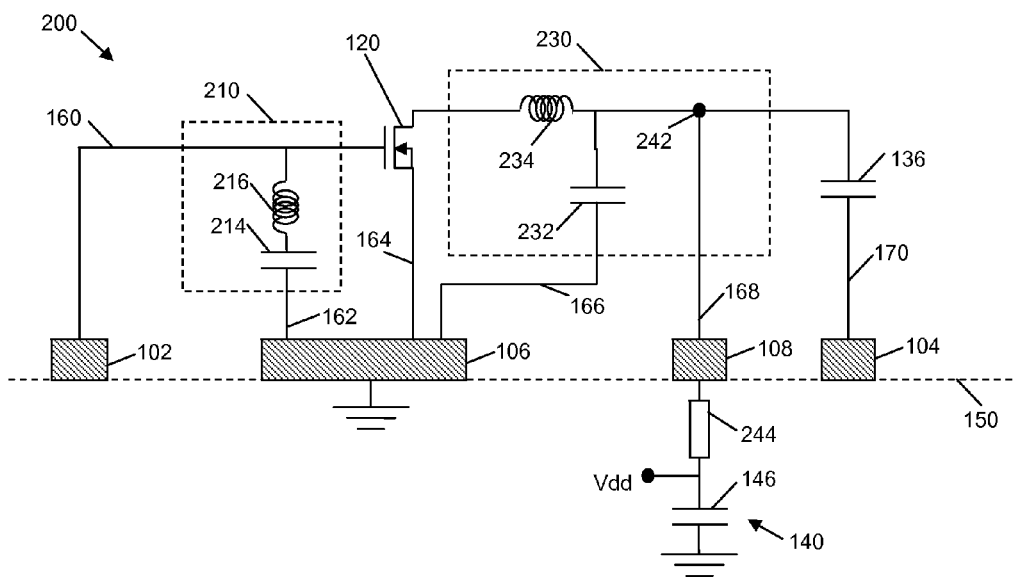
FIG. 2 is a schematic diagram of an RF amplifier with input and output circuits, in accordance with another example embodiment.
Figure 3:
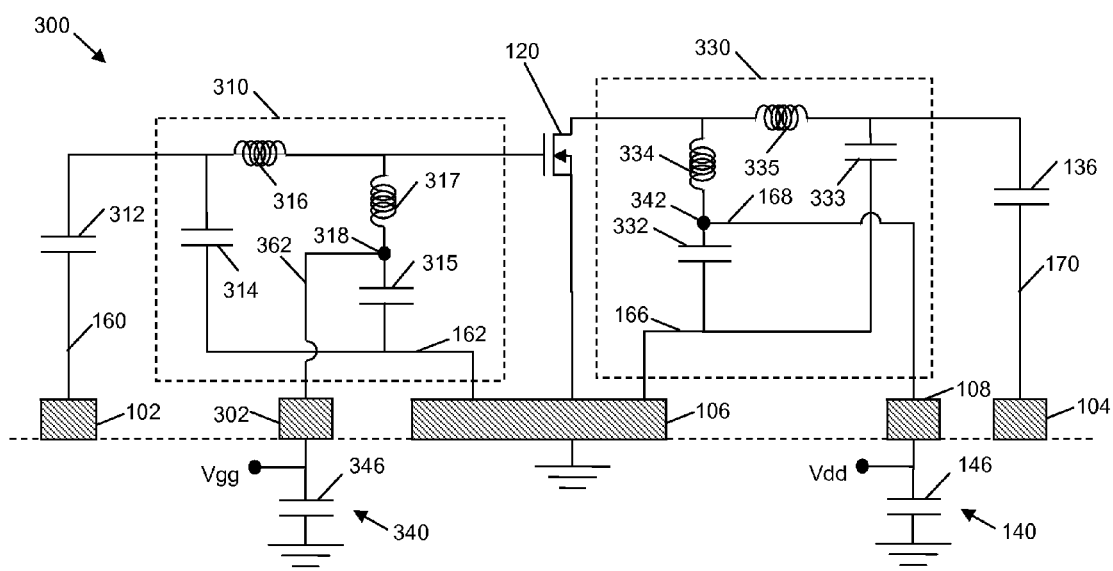
FIG. 3 is a schematic diagram of an RF amplifier with input and output circuits, in accordance with yet another example embodiment.

In the embodiment illustrated in FIG. 1, input circuit 110 is configured as a low pass filter, and output circuit 130 is configured as a high pass filter. As mentioned above, in an alternate embodiment of an amplifier 200, such as is illustrated in FIG. 2, input circuit 210 may be configured as a high pass filter, and/or output circuit 230 may be configured as a low pass filter. For example, a high pass filter input circuit 210 may include a shunt inductive element 216 and a shunt capacitor 214 coupled in series. More specifically, inductive element 216 has a first terminal that is electrically coupled to the gate of transistor 120, and also to input terminal 102 (e.g., through conductive structure(s) 160). Inductive element 216 has a second terminal that is coupled to a first plate (or terminal) of shunt capacitor 214. A second plate (or terminal) of shunt capacitor 214 is electrically coupled to the voltage reference terminal 106 (or another distinct voltage reference terminal) through conductive structure(s) 162.

A low pass filter output circuit 230 may include an inductive element 234 and a shunt capacitor 232. More specifically, a first terminal of inductive element 234 is electrically coupled to the drain of transistor 120, and a second terminal of inductive element 234 is electrically coupled to the output terminal 104 (e.g., through conductive structure(s) 170) and to a first plate (or terminal) of shunt capacitor 232. According to an embodiment, a DC blocking capacitor 136 may be coupled between the second terminal of inductive element 234 and the output terminal 104, as illustrated, or the DC blocking capacitor 136 may be excluded, in other embodiments. The first plate of shunt capacitor 232 also is electrically coupled to the output terminal 104 (e.g., through conductive structure(s) 170 and DC blocking capacitor 136, when included), and a second plate (or terminal) of shunt capacitor 232 is electrically coupled to the voltage reference terminal 106 (e.g., through conductive structure(s) 166).

In an exemplary embodiment, an RF low impedance node 242 is present between inductor 234 and DC blocking capacitor 236, when included. Through one or more additional conductive structures 168 (e.g., conductive vias) and terminal 108, node 242 may be coupled to an external circuit (e.g., including a voltage source, Vdd, and an envelope frequency termination circuit 140). To avoid directly coupling Vdd to RF low impedance node 242, high impedance element 244 is provided between Vdd and node 242, in an embodiment. The high impedance element 244 may be implemented, for example, as a quarter wave line or an inductive element. Although FIG. 2 shows high impedance element 244 implemented below the device plane 150 (e.g., on a PCB to which the device is coupled), high impedance element 244 may be implemented above the device plane 150 (e.g., coupled to or monolithically formed as part of the semiconductor substrate), in another embodiment. In an embodiment in which DC blocking capacitor 136 is excluded, terminals 104 and 108 may be replaced with a single terminal for outputting the amplified output signal, and Vdd, high impedance element 244, and/or envelope frequency termination circuit 140 may be provided at that terminal.

As also mentioned above, in another alternate embodiment, either or both of the input circuit and/or output circuit may be configured as a bandpass filter. For example, in the embodiment of an amplifier 300 illustrated in FIG. 3, both input circuit 310 and output circuit 330 are configured as bandpass filters. More specifically, bandpass filter input circuit 310 includes a low pass filter section and a high pass filter section. The low pass filter section includes an inductive element 316 and a shunt capacitor 314, and the high pass filter section includes a shunt inductive element 317 and a shunt capacitor 315 coupled in series. More specifically, shunt capacitor 314 has a first plate (or terminal) coupled to input terminal 102 (e.g., through conductive structure(s) 160), and a second plate (or terminal), which is electrically coupled to the voltage reference terminal 106 (or another distinct voltage reference terminal) through conductive structure(s) 162. Inductive element 316 has a first terminal that is electrically coupled to the input terminal 102 (e.g., through conductive structure(s) 160), and a second terminal that is electrically coupled to the gate of transistor 120. According to an embodiment, a DC blocking capacitor 312 may be coupled between the first terminal of inductive element 316 and the input terminal 102, as illustrated, or the DC blocking capacitor 312 may be excluded, in other embodiments. Inductive element 317 has a first terminal that is coupled to the second terminal of inductive element 316, and also to the gate of transistor 120. In addition, inductive element 317 has a second terminal that is coupled to a first plate (or terminal) of shunt capacitor 315. A second plate (or terminal) of shunt capacitor 315 is electrically coupled to the voltage reference terminal 106 (or another distinct voltage reference terminal) through conductive structure(s) 162.

In an exemplary embodiment, an RF cold point node 318 is present between inductor 317 and shunt capacitor 315. Through one or more additional conductive structures 362 (e.g., conductive vias) and RF cold point node terminal 302, the RF cold point node 318 may be coupled to an external circuit (e.g., including a voltage source, Vgg, and an envelope frequency termination circuit 340).

Bandpass filter out circuit 330 also includes a high pass filter section and a low pass filter section. The high pass filter section includes a shunt inductive element 334 and a shunt capacitor 332 coupled in series, and the low pass filter section includes an inductive element 335 and a shunt capacitor 333. More specifically, inductive element 334 has a first terminal that is coupled to the drain of transistor 120, and also to a first terminal of inductive element 335. In addition, inductive element 334 has a second terminal that is coupled to a first plate (or terminal) of shunt capacitor 332. A second plate (or terminal) of shunt capacitor 332 is electrically coupled to the voltage reference terminal 106 (or another distinct voltage reference terminal) through conductive structure(s) 166. Inductive element 335 has a first terminal that is electrically coupled to the drain of transistor 120 and to the first terminal of inductive element 334, and a second terminal that is coupled to the output terminal 104 (e.g., through conductive structure(s) 170). According to an embodiment, a DC blocking capacitor 136 may be coupled between the second terminal of inductive element 335 and the output terminal 104, as illustrated, or the DC blocking capacitor 136 may be excluded, in other embodiments. The second terminal of inductive element 335 also is coupled to a first plate (or terminal) of shunt capacitor 333. A second plate (or terminal) of shunt capacitor 333 is electrically coupled to the voltage reference terminal 106 (or another distinct voltage reference terminal) through conductive structure(s) 166.

In an exemplary embodiment, an RF cold point node 342 is present between inductor 334 and shunt capacitor 332. Through one or more additional conductive structures 168 (e.g., conductive vias) and RF cold point node terminal 108, the RF cold point node 342 may be coupled to an external circuit (e.g., including a voltage source, Vdd, and an envelope frequency termination circuit 140).

Figure 5:
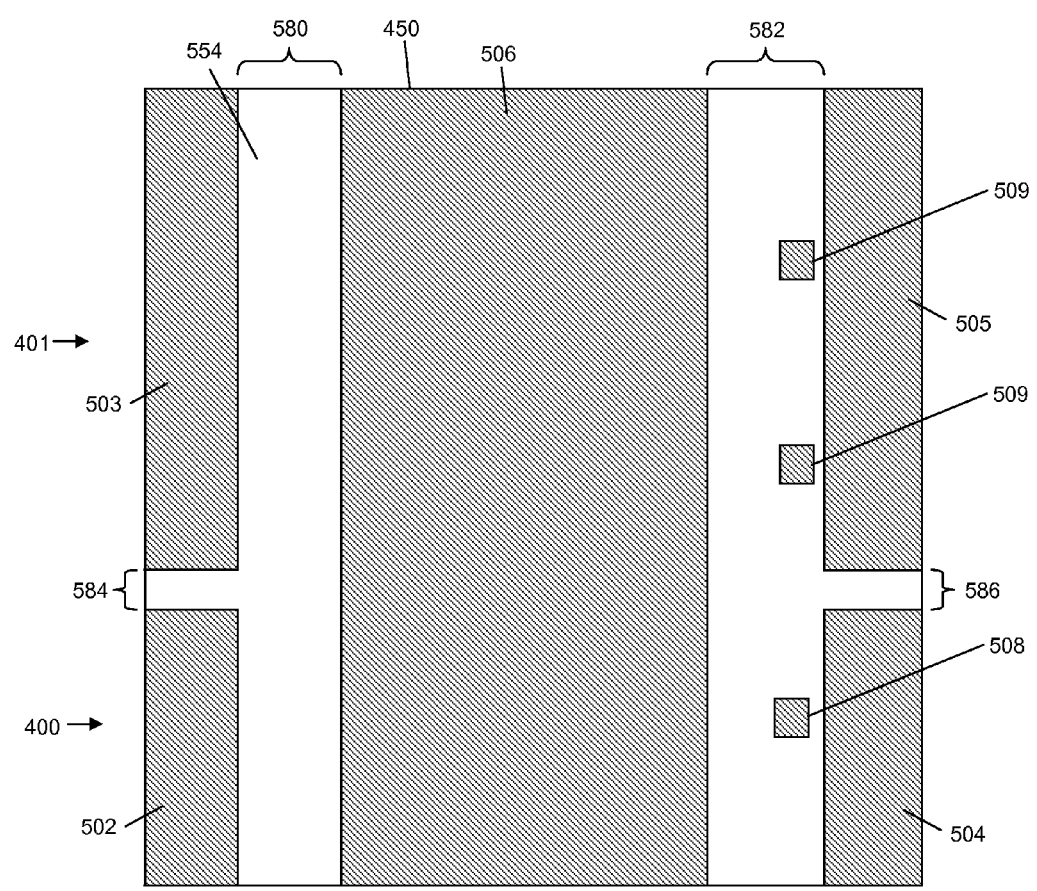
FIG. 5 is a bottom view of the die of FIG. 4, in accordance with an embodiment.
Figure 6:
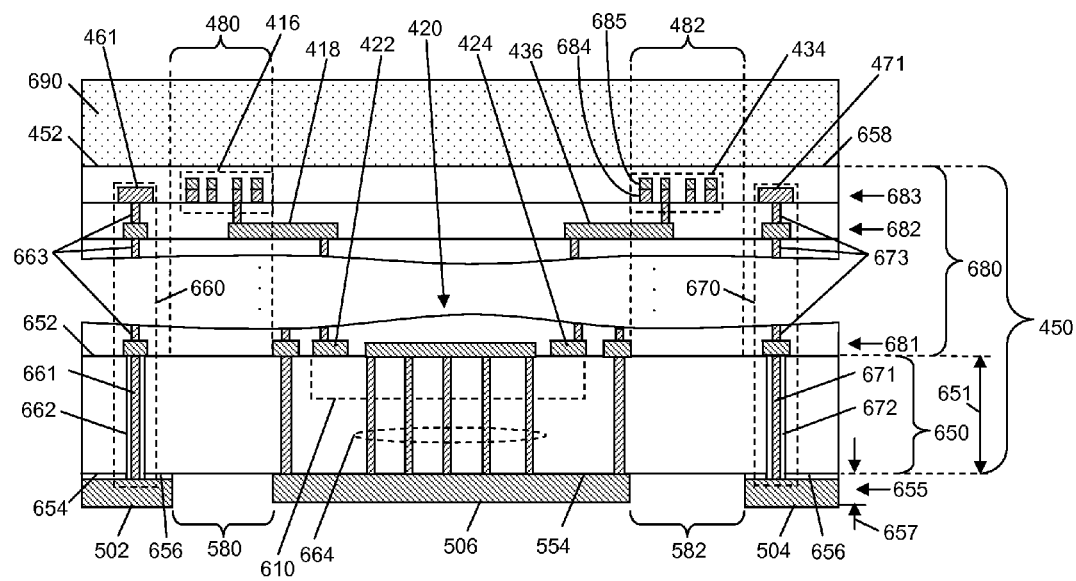
FIG. 6 is a cross-sectional, side view of the die of FIG. 4 along line 6-6.
Figure 7:
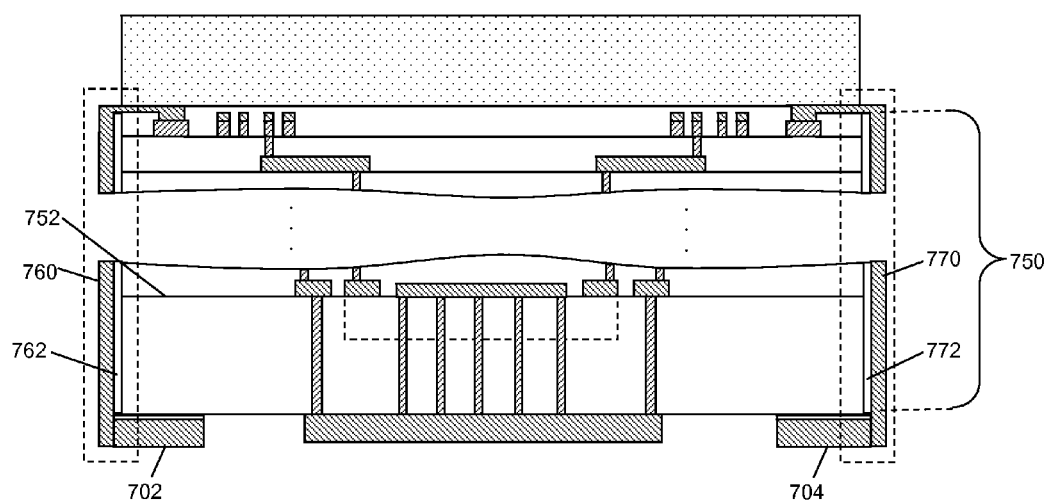
FIG. 7 is a cross-sectional, side view of an embodiment of a semiconductor die with wrap-around terminations, in accordance with an embodiment.
Figure 8:
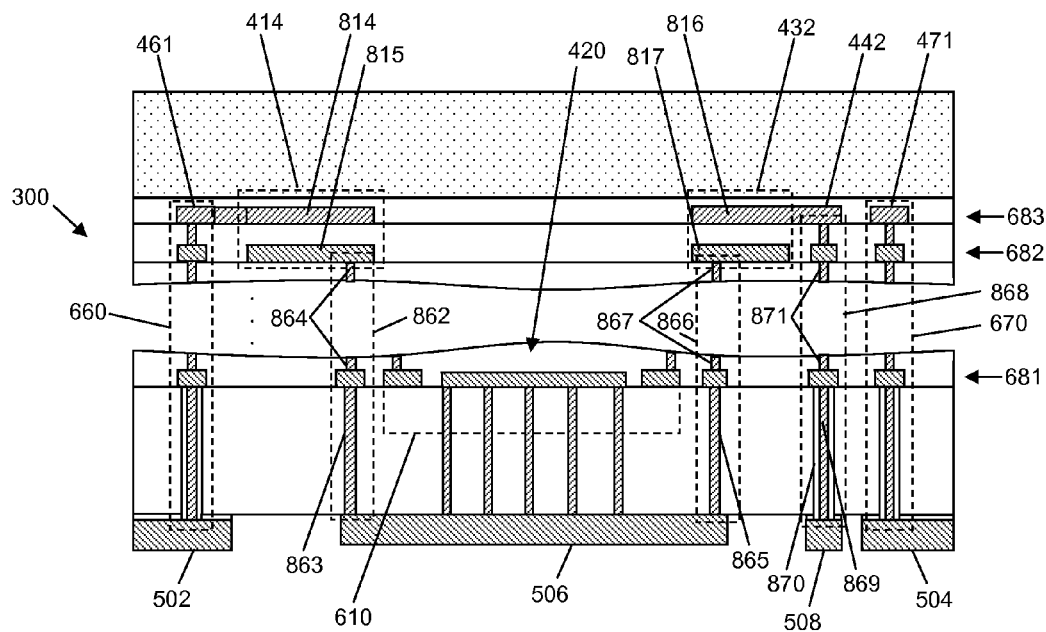
FIG. 8 is a cross-sectional, side view of the die of FIG. 4 along line 8-8.
Figure 9:
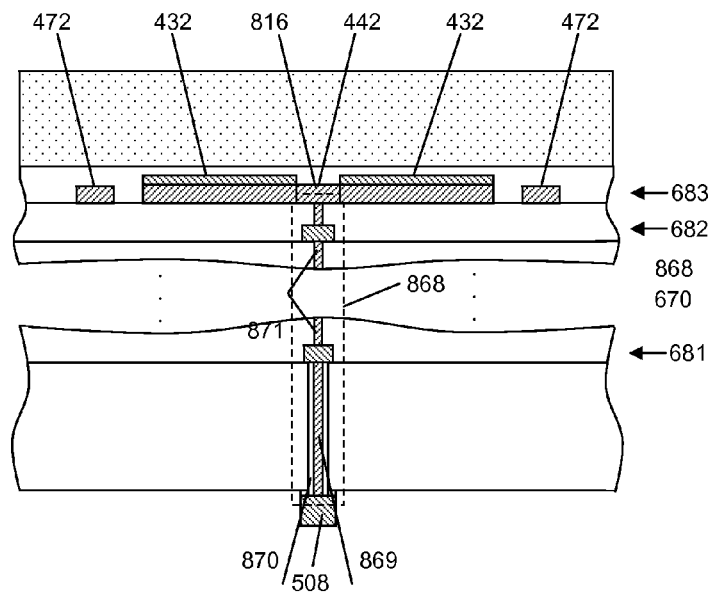
FIG. 9 is a cross-sectional, side view of the die of FIG. 4 along line 9-9.

Embodiments of integrated circuit implementations of the amplifier of FIG. 1 will now be described. FIGS. 4 and 5, which should be viewed together for increased understanding, are top and bottom views, respectively, of a semiconductor die 450, which includes portions of two amplifier paths 400, 401, in accordance with an example embodiment. FIGS. 6-10 also will be referenced in the description of semiconductor die 450, as those figures illustrate various cross-sectional or enlarged views of portions of die 450, and those views are helpful in understanding the various details of the embodiments. More specifically, FIGS. 6, 8, and 9 are cross-sectional, side views of die 450 along lines 6-6, 8-8, and 9-9, respectively, in FIG. 4, and FIG. 7 is an alternative embodiment of a cross-sectional, side view of a die along a line that would correspond to line 6-6 in FIG. 4. It should be noted that the cross-sectional views in FIGS. 6-9 depict encapsulant material (e.g., encapsulant material 690) overlying the top surface of the die (e.g., die 450). However, to avoid obscuring the underlying features, the encapsulant material is not depicted in the top views of FIGS. 4 and 10. Further, the encapsulant material may be excluded in some embodiments.

Referring first to FIGS. 4 and 6, die 450 includes a semiconductor substrate 650 with top and bottom substrate surfaces 652, 654, and a plurality of dielectric and conductive layers 680 (referred to as "build-up" layers herein) formed over and coupled to the top substrate surface 652. In the various cross sectional figures, only the lowest (i.e., closest to substrate 650) and highest (i.e., closest to the top die surface 452) build up layers 680 are depicted for simplicity, and vertical ellipses " . . . " are included to indicate that additional dielectric and conductive layers may be included between the lowest and highest build up layers 680. For example, the conductive layer 681 closest to the top substrate surface 652 may be the M1 layer (metal 1 layer), and the conductive layers 682, 683 closest to the top die surface 452 may be the M4 and M5 layers, respectively. For example, conductive layers 681-683 may be formed from aluminum-copper-tungsten (AlCuW) or other commonly-used conductive layer materials. As will be described later, according to an embodiment, all or portions of the metal layer (e.g., layer 683) included in inductors 416, 417, 434, 435 may include materials that are different from the materials of underlying metal layers (e.g., layers 681, 682). Although an example embodiment is described herein with five metal layers 681-683 (e.g., M1-M5), a device may have more or fewer metal layers, as well. Further, although the below description describes inductors 416, 417, 434, 435 and capacitors 414, 415, 432, 433 as being formed from portions of particular metal layers 682, 683, the inductors 416, 417, 434, 435 and capacitors 414, 415, 432, 433 could be formed from portions of other metal layers, as well.

The bottom substrate surface 654 corresponds to the bottom surface 554 (FIG. 5) of die 450, and the top surface 658 of the build-up layers 680 corresponds to the top surface 452 of the die 450. As mentioned above, encapsulant material 690 (e.g., plastic encapsulant) may be coupled to the top die surface 452, although the encapsulant material 690 may be excluded, in other embodiments.

In various embodiments, the semiconductor substrate 650 may comprise silicon, silicon-on-insulator (SOI), silicon-on-sapphire (SOS), gallium arsenide (GaAs), gallium nitride (GaN), GaN on silicon carbide, GaN on silicon, or other types of substrate materials. For example, the substrate 650 may have a thickness 651 in a range of about 50 microns to about 100 microns (e.g., about 75 microns), although the substrate 650 may be thinner or thicker, as well. The substrate 650 may include, for example, a base semiconductor substrate and one or more additional semiconductor layers epitaxially formed on the surface of the base semiconductor substrate. In a particular example embodiment, the substrate 650 is a high-resistivity silicon substrate (e.g., a silicon substrate having bulk resistivity in a range of about 1000 ohm/centimeter (cm) to about 100,000 ohm/cm or greater). Alternatively, the substrate 650 may be a semi-insulating GaAs substrate (e.g., a GaAs substrate having bulk resistivity up to $10^8$ ohm/cm), or another suitable high-resistivity substrate. In such embodiments, and as will be described in detail later, electrical connections between the top and bottom substrate surfaces 652, 654 may be made using conductive through substrate vias (TSVs) (e.g., TSVs 661, 664, 671, 863, 865, 869, FIGS. 6, 8). Alternatively, electrical connections between top and bottom substrate surfaces 652, 654 may be made using wrap-around terminations (e.g., wrap-around terminations 760, 770, FIG. 7) or using other conductive structures. Still other embodiments may be implemented using low-resistivity substrates.

A plurality of active and passive components is formed in and over semiconductor substrate 650. More specifically, each amplifier path 400, 401 includes an input circuit (e.g., input circuit 110, FIG. 1) that includes at least one inductor 416, 417 (e.g., inductive element 116, FIG. 1) and at least one capacitor 414, 415 (e.g., capacitor 114, FIG. 1), a transistor 420, 421 (e.g., transistor 120, FIG. 1), and an output circuit (e.g., output circuit 130, FIG. 1) that includes at least one inductor 434, 435 (e.g., inductive element 134, FIG. 1) and at least one capacitor 432, 433 (e.g., capacitor 132, FIG. 1). Transistors 420, 421 represent the amplification components of amplifier paths 400, 401. In the illustrated embodiments, each amplifier path 400, 401 is a single stage amplifier (e.g., each including one power transistor 420, 421). In an alternate embodiment, each amplifier path may be implemented as a multi-stage amplifier (e.g., with a pre-amplifier transistor in series with a final amplifier transistor). In such an embodiment, a matching circuit may be implemented between the pre-amplifier and final amplifier stages.

Through various conductive structures, which will be described in more detail below, the active and passive components of die 450 are electrically coupled to each other and to a plurality of conductive features 502, 503, 504, 505, 506 (e.g., conductive components 102, 104, 106, 108, FIG. 1) that are coupled to the bottom substrate surface 654. Those conductive features 502-506 facilitate electrical connection of the die's active and passive components to external circuitry (e.g., circuitry 140, FIG. 4, and 1850, 1852, 1860, 1862, FIG. 18).

Various views of the plurality of conductive features 502-506 are shown in FIGS. 5, 6, 8, and 9. Because the relative locations of the conductive features 502-506 with respect to the other circuitry that overlies the top substrate surface 652 is relevant to the inventive subject matter, the conductive features 502-506 also are indicated in FIG. 4, although with dashed borders to indicate that they are not proximate to the top substrate surface 652, but instead are coupled to the bottom die surface 554.

Each of the conductive features 502-506 only partially covers the bottom die surface 554 to define a number of conductor-less regions 580, 582, 584, 586 that span various portions of the bottom die surface 554. As used herein, a "conductor-less region" is a portion of the bottom die surface 554 to which no conductive material (or at least no significant quantity of conductive material) is coupled. According to an embodiment, the various conductive features 502-506 are electrically isolated from each other across the bottom die surface 554 by the conductor-less regions 580, 582, 584, 586. Conductor-less regions 584, 586 provide for electrical separation of the input signals provided to amplifier paths 400, 401. As will be described in more detail later, conductor-less regions 580, 582 are located directly opposite (in a vertical direction, with respect to FIG. 6) portions 480, 482 of the top substrate surface 652 over which inductors 416, 417, 434, 435 are formed. Because the voltage reference plane is lacking under inductors 415, 417, 434, 435 in the device, according to the various embodiments, inductors 415, 417, 434, 435 may be referred to herein as "floating" inductors. Inclusion of the conductor-less regions 580, 582 under floating inductors 415, 417, 434, 435 may achieve multiple advantages, as will be discussed in more detail later.

According to an embodiment, the conductive features 502-506 each may form a portion of a patterned conductive layer 655 that is coupled to the bottom substrate surface 654, where voids in the patterned conductive layer 655 correspond to the conductor-less regions 580, 582, 584, 586. Some or all of the conductive features 502-506 may be directly connected to the bottom substrate surface 654, or an insulating layer 656 may be present between some or all of the conductive features 502-506 in order to electrically isolate them from the substrate 650, in various embodiments. According to an embodiment, conductive layer 655 includes plated copper (i.e., multiple layers applied using a plating process) or other conductive metal or metal alloy, and conductive layer 655 has a thickness 657 in a range of about 10 microns to about 50 microns. The patterned conductive layer 655 may be formed from one or more layers of a single conductive material, or may be formed from layers of different materials. In addition, the patterned conductive layer 655 may be thinner or thicker than the above-given range. Alternatively, the conductive features 502-506 may be distinct structures that are otherwise coupled (e.g., bonded, soldered, adhered, and so on) to the bottom substrate surface 654.

In any event conductive features 502, 503 represent input terminals (e.g., two instances of terminal 102, FIG. 1) for the first and second amplifier paths 400, 401, respectively, and conductive features 504, 505 represent output terminals (e.g., two instances of terminal 104, FIG. 1) for the first and second amplifier paths 400, 401, respectively. Conductive feature 506 represents a voltage reference terminal (e.g., voltage reference terminal 106, FIG. 1), and although the voltage reference terminal is depicted as a single conductive feature 506 in the illustrated embodiments, a set of distinct and separate conductive features alternatively may serve as a plurality of voltage reference terminals, in an alternate embodiment. Further, conductive features 508, 509 (FIGS. 5, 8, 9) represent terminals (e.g., three instances of terminal 108, FIG. 1) that enable portions of the amplifier paths 400, 401 to be coupled to other external circuitry. For example, conductive features 508, 509 may represent RF cold point node terminals (e.g., multiple instances of RF cold point node terminal 108), which enable RF cold points (e.g., node 148, FIG. 1) to be coupled with external circuitry (e.g., with envelope frequency termination circuitry 140, FIG. 1). As will be described in more detail later, the nodes between inductors 434, 435 and capacitors 432, 433 represent RF cold point nodes. In addition, conductive features 508, 509 may enable a bias voltage (e.g., Vdd) to be provided to the drain terminals 424, 425 of transistors 420, 421 of each amplifier path 400, 401. Although not illustrated, similar conductive features may be provided to an RF cold point node in the input circuit, to provide the ability to provide a bias voltage to be provided to the control terminals 422, 423 of transistors 420, 421, as well.

The interconnections between the various components of die 450 along amplification path 400 will now be described in more detail. It should be understood that substantially similar interconnections may be implemented along amplification path 401. In any event, and with reference to FIGS. 4-6 and 8, conductive feature 502, which is configured to receive an input RF signal, is electrically connected to the input circuit (e.g., input circuit 110, FIG. 1) through a first set of conductive structures 660 (e.g., conductive structures 160, FIG. 1) that provide a continuous electrical path between conductive feature 502 and an input node 461 to the input circuit (e.g., node 161, FIG. 1). According to an embodiment, the first set of conductive structures 660 may include one or more TSVs 661, portions of conductive layers 681-683, and conductive vias 663 that electrically couple the portions of the conductive layers 681-683. TSVs 661 may be electrically isolated from substrate 650 with dielectric via lining material 662, in an embodiment, although lining material 662 may be excluded, in other embodiments.

As most clearly depicted in FIGS. 4 and 6, the input circuit for path 400 includes inductors 416 (e.g., parallel instances of inductor 116, FIG. 1) and capacitor 414 (e.g., capacitor 114, FIG. 1), and the input circuit for path 401 includes inductors 417 (e.g., parallel instances of inductor 116, FIG. 1) and capacitors 415 (e.g., capacitor 114, FIG. 1). More specifically, the input circuit for path 400 includes inductors 416, which are coupled in parallel between node 461 and the control terminal 422 (e.g., gate) of transistor 420 (e.g., transistor 120, FIG. 1). Similarly, the input circuit for path 401 includes inductors 417, which are coupled in parallel between conductive structure 461 and the control terminal 423 of transistor 421. Each of inductors 416, 417 is implemented as an integrated spiral inductor formed from portions of one or more conductive layers (e.g., layers 682, 683). The spiral inductors may be formed from as few as one conductive layer or from multiple conductive layers, with conductive vias interconnecting the inductor portions, and cross-overs and cross-unders implemented, as appropriate. A first (input) terminal of each inductor 416, 417 is coupled to the input node of its respective input circuit, and a second (output) terminal of each inductor 416, 417 is coupled through portions 418, 419 of a conductive layer (e.g., conductive layer 682) to the control terminals 422, 423 of transistors 420, 421.

As most clearly depicted in FIGS. 4 and 8, capacitors 414, 415 are coupled between the input circuit input node (e.g., node 461 for path 400) and voltage reference terminal 506 (e.g., terminal 106, FIG. 1). More specifically, a first plate (or electrode) 814 of capacitor 414 is coupled to node 461 (and thus to the input terminal of inductor 416), and a second plate (or electrode) 815 of capacitor 414 is coupled to the voltage reference terminal 506 through conductive structures 862 (e.g., conductive structures 162, FIG. 1). Capacitors 415 are similarly coupled between conductive structure 461 and the voltage reference terminal 506. In the illustrated embodiment, capacitors 414, 415 are implemented as metal-insulator-metal (MIM) capacitors, each of which includes vertically aligned portions of two conductive layers 683, 682 (e.g., the first and second capacitor plates 814, 815) and inter-layer dielectric between the capacitor plates 814, 815. In addition, conductive structures 862 may include one or more TSVs 863, portions of conductive layers 681, 682, and conductive vias 864 that electrically couple the portions of the conductive layers 681, 682. Although not shown, TSVs 863 may be electrically isolated from substrate 650 with dielectric via lining material, in an embodiment, although lining material may be excluded, in other embodiments.

Figure 10:
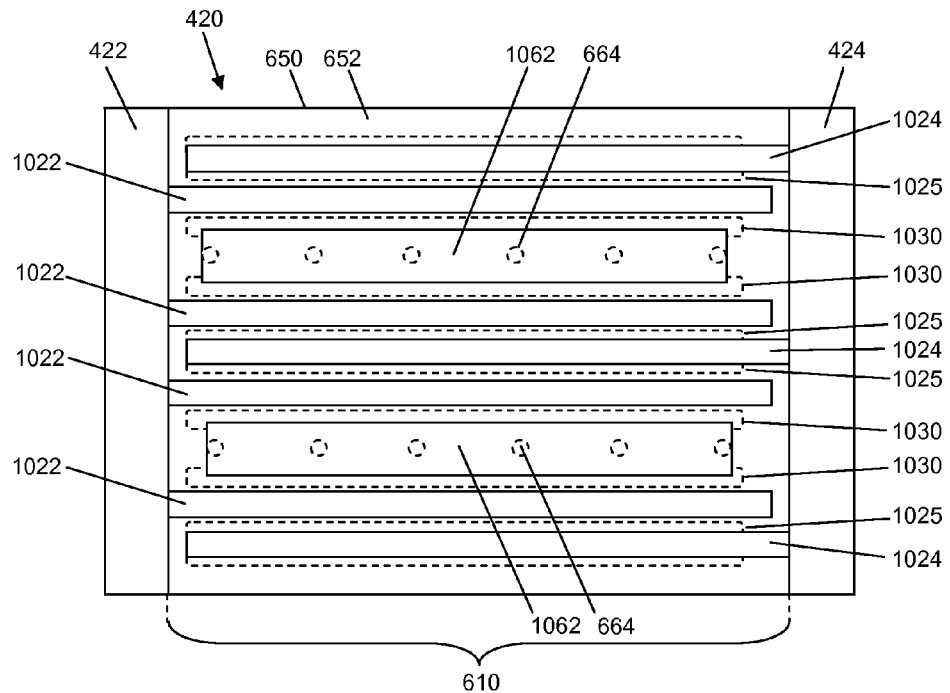
FIG. 10 is an enlarged, top view of the die of FIG. 4 in area 10.

As mentioned previously, transistors 420, 421 may be LDMOS FET transistors, for example. Each transistor 420, 421 includes a control terminal 422, 423 (e.g., gate), a first current conducting region (e.g., a drain region coupled to a drain terminal 424, 425), and a second current conducting region (e.g., a source region). As discussed in conjunction with FIG. 1, the control terminal is coupled to the input circuit 110, one of the current conducting regions (e.g., the drain region) is coupled to the output circuit 130, and the other current conducting region (e.g., the source region) is coupled to a voltage reference. Referring now to FIG. 10, which is a top view of portion 10 (FIG. 4) of transistor 420, additional details of transistor 420 will now be described. Reference also will be made to the cross-sectional view of FIG. 6, for clarity.

Referring to FIG. 10, transistor 420 includes an active area 610, with a plurality of substantially parallel-aligned drain regions 1025 and source regions 1030 (outlined with dashed rectangles) formed in the substrate 650 below the top substrate surface 652. Due to their elongated shapes and interdigitated arrangements, the drain and source regions 1025, 1030 may be referred to as "fingers." In any event, drain regions 1025 are electrically coupled to conductive (e.g., metal) drain finger contacts 1024, each of which extends to drain contact 424. Source regions 1030 are electrically coupled to conductive (e.g., metal) source finger contacts 1062, which in turn are coupled to conductive TSVs 664 (FIG. 6) that extend through substrate 650 to conductive feature 506 (e.g., voltage reference terminal 106, FIG. 1).

TSVs 664 may or may not be lined with dielectric material to insulate the TSVs 664 from the substrate 650, in various embodiments. A variably-conductive channel and, in some embodiments, a drain drift region are present between adjacent source and drain regions 1030, 1025 of each transistor finger. Conductive (e.g., polysilicon) gate structures 1022 are coupled to and extend from gate contact 422 across the channel regions so that voltages applied to the gate contact 422 during operation may modulate the conductivity of the channels, and thus the current flow between source and drain regions 1030, 1025 (or ultimately between conductive feature 506 and drain contact 424).

Although a particular layout of an LDMOS FET is illustrated in FIG. 10, it should be understood that many different layouts may be implemented to provide the transistor(s), in various embodiments. For example, in some embodiments, doped sinker regions may be used to provide portions of the electrical path between the source regions and the conductive feature 506 at the bottom substrate surface 654. Numerous other modifications also may be made, depending on the characteristics of the selected substrate and the operation and performance of the transistor.

Referring again to FIGS. 4-6 and 8, drain terminals 424, 425 of transistors 420, 421 are electrically coupled to conductive features 504, 505 (e.g., two instances of terminal 104, FIG. 1) and also to output circuits (e.g., two instances of output circuit 130, FIG. 1). Considering first the electrical coupling between drain terminals 424, 425 and conductive features 504, 505, the top view of FIG. 4 illustrates multiple instances of conductive features 472, 474 extending between drain terminals 424, 425 and nodes 471, 473 (e.g., multiple instances of node 171, FIG. 1). Conductive features 472, 474 may include, for example, portions of one or more conductive layers 681-683 and conductive vias interconnecting the drain terminals 424, 425 and the portions of the conductive layers 681-683, as appropriate. As most clearly indicated in the cross-sectional view of FIG. 6, nodes 471, 473 are electrically coupled to the conductive features 504, 505 (and thus the drain terminals 424, 425 are electrically coupled to the conductive features 504, 505). For example, FIG. 6 depicts node 471 as being coupled to conductive feature 504 through a set of conductive structures 670 (e.g., node 171 is coupled to terminal 104 through conductive structure 170, FIG. 1). The set of conductive structures 670 provides a continuous electrical path between node 471 and conductive feature 504. According to an embodiment, the set of conductive structures 670 may include one or more TSVs 671, portions of conductive layers 681-683, and conductive vias 673 that electrically couple the portions of the conductive layers 681-683. TSVs 671 may be electrically isolated from substrate 650 with dielectric via lining material 672, in an embodiment, although lining material 672 may be excluded, in other embodiments. In any event, when die 450 is incorporated into an amplifier system, conductive features 504, 505 are configured to output the amplified RF signals produced by transistors 420, 421.

As mentioned above, the drain terminals 424, 425 also are electrically connected to the output circuits (e.g., two instances of output circuit 130, FIG. 1). As most clearly depicted in FIGS. 4 and 6, the output circuit for path 400 includes inductors 434 (e.g., parallel instances of inductor 134, FIG. 1) and capacitor 432 (e.g., capacitor 132, FIG. 1), and the output circuit for path 401 includes inductors 435 (e.g., parallel instances of inductor 134, FIG. 1) and capacitors 433 (e.g., capacitor 132, FIG. 1). More specifically, the output circuit for path 400 includes inductors 434, which are coupled in parallel between drain terminal 424 (or node 471) and node 442 (e.g., node 142, FIG. 1). In addition, as most clearly depicted in FIG. 8, the output circuit also includes capacitor 432, which is coupled between node 442 and conductive feature 506 through another set of conductive structures 866.

Each of inductors 434, 435 is implemented as an integrated spiral inductor formed from portions of one or more conductive layers (e.g., layers 682, 683). The spiral inductors may be formed from as few as one conductive layer or from multiple conductive layers, with conductive vias interconnecting the inductor portions, and cross-overs and cross-unders implemented, as appropriate. According to an embodiment, at least the portion of top conductive layer 683 that includes inductors 416, 417, 434, 435 may be formed from or include a material that is different from (e.g., more highly conductive than) the material(s) from which the lower metal layers 681, 682, and/or other portions of layer 683 are formed. For example, as illustrated in FIG. 6, portions of layer 683 corresponding to inductors 416, 417, 434, 435 may include multiple conductive material layers 684, 685. For example, the bottom conductive material layer 684 may comprise AlCuW (or some other material), as discussed previously, and the top conductive material layer 685 may comprise copper (Cu) or some other highly conductive material. Alternatively, the portions of layer 683 corresponding to some or all of inductors 416, 417, 434, 435 may include a single layer of the more highly conductive material (e.g., Cu). The inclusion of the highly conductive material may increase the Q of inductors 416, 417, 434, 435, which may be particularly advantageous for inductors 434, 435 in the output circuit, since the Q of inductors 434, 435 on the higher-power side of the amplifier path 400 may more significantly affect the efficiency of the amplifier than the Q of inductors 416, 417 on the lower-power side of the amplifier path 400. In still other embodiments, the portions of layer 683 corresponding to some or all of inductors 416, 417, 434, 435 may include substantially the same materials as the other layers 681, 682.

A first (input) terminal of each inductor 434, 435 is coupled though portions 436, 437 of a conductive layer (e.g., conductive layer 682) to the drain terminal 424, 425 of transistors 420, 421, respectively. As shown most clearly in FIGS. 4, and 9, a second (output) terminal of each inductor 434, 435 is coupled to nodes 442, 444. As discussed previously in the description of FIG. 1, the values of inductor 434 and capacitor 432 may be selected so that node 442 (or node 142, FIG. 1) between inductor 434 and capacitor 432 functions as an RF cold point node.

As most clearly depicted in FIGS. 4 and 8, capacitors 432, 433 are coupled between node 442 for path 400) and voltage reference terminal 506 (e.g., terminal 106, FIG. 1). More specifically, a first plate (or electrode) 816 of capacitor 432 is coupled to node 442 (and thus to the output terminal of inductor 434), and a second plate (or electrode) 817 of capacitor 432 is coupled to the voltage reference terminal 506 through conductive structures 866 (e.g., conductive structures 166, FIG. 1). Capacitors 433 are similarly coupled between nodes 444 and the voltage reference terminal 506. In the illustrated embodiment, capacitors 432, 433 are implemented as MIM capacitors, each of which includes vertically aligned portions of two conductive layers 683, 682 (e.g., the first and second capacitor plates 816, 817) and inter-layer dielectric between the capacitor plates 816, 817. In addition, conductive structures 866 may include one or more TSVs 865, portions of conductive layers 681, 682, and conductive vias 867 that electrically couple the portions of the conductive layers 681, 682. Although not shown, TSVs 865 may be electrically isolated from substrate 650 with dielectric via lining material, in an embodiment, although lining material may be excluded, in other embodiments.

As discussed previously, nodes 442, 444 may represent RF cold points between inductors 434, 435 and capacitors 432, 433. According to an embodiment, die 450 includes further conductive features that electrically couple RF cold point nodes 442, 444 to terminal 508, 509 (e.g., multiple instances of terminal 108, FIG. 1), which provides the ability to couple external circuitry (e.g., circuitry 140, FIG. 1) to the RF cold point nodes 442, 444. As most clearly depicted in FIGS. 8 and 9, for example, along path 400, die 450 includes conductive structures 868 (e.g., conductive structures 168, FIG. 1) that electrically couple RF cold point node 442 and terminal 508. Conductive structures 868 may include one or more TSVs 869, portions of conductive layers 681-683, and conductive vias 871 that electrically couple the portions of the conductive layers 681-683. TSVs 869 may be electrically isolated from substrate 650 with dielectric via lining material 870, in an embodiment, although lining material 870 may be excluded, in other embodiments.

In the above-described embodiments, conductive structures 660, 670, 862, 866, 868 (including TSVs 661, 671, 863, 865, 869) are used to provide electrical connections between components formed over the top substrate surface 652 and conductive features 502-506 coupled to the bottom substrate surface 654. In alternate embodiments, alternative conductive structures may be implemented to replace all or portions of conductive structures 660, 670, 862, 866, 868. For example, in an alternate embodiment depicted in FIG. 7 (which corresponds in location to the cross-sectional view of FIG. 6), conductive structures 660, 670 may be replaced with conductive wrap-around terminations 760, 770 which are coupled to side surfaces of die 750 to interconnect conductive features 702, 704 with the input and output circuits located over the top substrate surface 752. The wrap-around terminations 760, 770 may be electrically isolated from substrate 752 with dielectric material 762, 772, in an embodiment, although the dielectric material 762, 772 may be excluded, in other embodiments. In other alternate embodiments, other types of conductive structures (e.g., printed conductive lines, wirebonds, and so on) may be used to interconnect conductive features corresponding to the input and output terminals with the input and output circuits, respectively. In still other alternate embodiments, some or all of conductive structures 862, 866, 868 may be similarly replaced with wrap-around terminations or other types of conductive structures.

Die 450 is shown to include portions of two parallel amplifier paths 400, 401. In such an embodiment, one or more isolation features 490 may be embedded within the die 450, within encapsulant 490, or otherwise interposed between the parallel amplification paths 400, 401 in order to reduce potential signal interference between the two paths. Further, the transistors 420, 421 of amplifier paths 400, 401 are of different sizes, as indicated by their different areas. Accordingly, the transistors 420, 421 may have different current-carrying capacities. For example, transistor 421 may be capable of handling twice the current of transistor 420. Such an arrangement may be particularly advantageous, for example, in an asymmetric Doherty amplifier (e.g., Doherty amplifier 1800, FIG. 18), in which the peaking amplifier may be significantly larger than the main amplifier. In an alternate embodiment, transistors 420, 421 may be substantially the same in size and/or current carrying capacity (e.g., for use in a symmetric Doherty amplifier or another type of amplifier).

Although die 450 is shown to include two parallel amplifier paths 400, 401, alternate embodiments of die may include a portion of a single amplifier path. Still other alternate embodiments of die may include portions of more than two amplifier paths. In the illustrated embodiment, the first and second amplifier paths 400, 401 may correspond to main and peaking amplifier paths, respectively, of a Doherty amplifier. Alternatively, the first and second amplifier paths 400, 401 may be incorporated into other types of amplifiers, as well. For conciseness, only amplifier path 400 will be described in detail, it being understood that amplifier path 401 includes substantially similar features.

Although the embodiments of FIGS. 4-10 embody circuitry corresponding to the amplifier configuration 100 of FIG. 1, it should be understood that alternate embodiments of IC devices may embody differently configured amplifiers (e.g., amplifiers 200, 300, FIG. 2, 3, or other differently configured amplifiers). A common aspect to the various embodiments is the inclusion of one or more "floating" inductors in the input and/or output circuits of an amplifier path. Those of skill in the art would understand, based on the description herein, how to incorporate one or more of such floating inductors into differently configured amplifier ICs.

Figure 11:
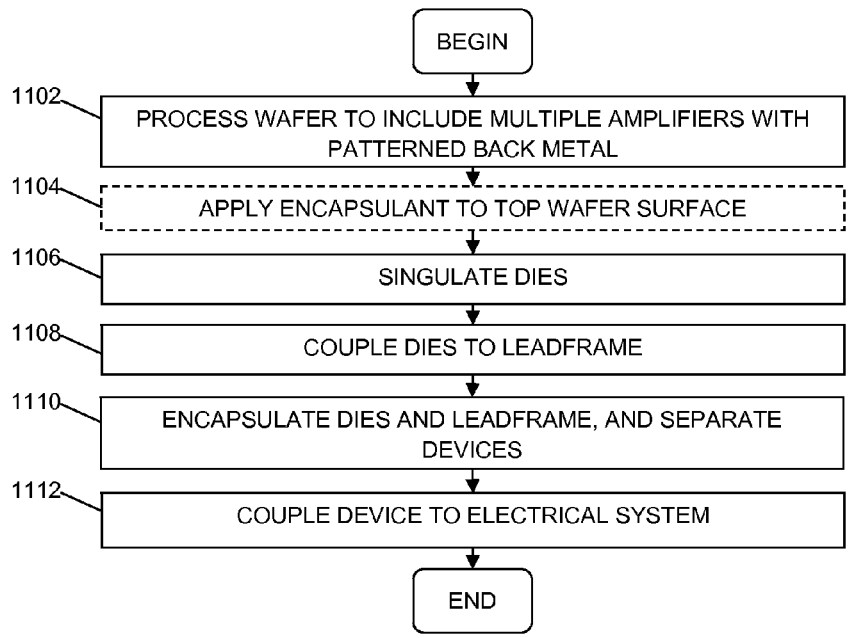
FIG. 11 is a flowchart of a method of manufacturing and packaging an amplifier, and incorporating the amplifier into an amplifier system, in accordance with an example embodiment.

FIG. 11 is a flowchart of a method of manufacturing a device (e.g., die 450) that includes at least a portion of an amplifier. As will be discussed below, wafer-level chip-scale packaging (WLCSP) techniques may be used to complete the device so that it may readily be coupled to a PCB that includes other portions of an amplifier (e.g., a Doherty amplifier 1800, FIG. 18, or another type of amplifier), in accordance with an example embodiment. Alternatively, after formation of die 450, the die 450 may be coupled to leads (e.g., leads 1202-1205, FIG. 12) and/or a flange or heat sink (e.g., heat sink 1206, FIG. 12), and the leaded assembly (e.g., device 1500, FIG. 15) may be coupled (e.g., soldered) to a PCB (e.g., PCB 1610, FIG. 16) that includes other portions of an amplifier.

In block 1102, wafer manufacturing techniques are used to fabricate a wafer that includes a multitude of instances of the above-described amplifier circuitry (e.g., a multitude of die sites, each of which includes the circuitry of die 450). Although conventional wafer fabrication techniques are not discussed in detail herein for the purpose of brevity, fabrication of the wafer includes processes in which vias (e.g., vias 661, 664, 671, 863, 865, 869) are formed through a semiconductor substrate (e.g., substrate 650), and various active devices (e.g., transistors 420, 421) and passive devices (e.g., inductors 416, 417, 434, 435 and capacitors 415, 415, 432, 433), along with their interconnections, are formed in and over a top surface of the wafer. The back side of the wafer may then be thinned to a desired thickness, which exposes bottom-side ends of the vias. Conductive features (e.g., conductive features 502, 504, 506, 508) are then coupled to the bottom surface of the thinned wafer. For example, a thick patterned back metal layer may be applied to the bottom surface of the wafer produce the conductive features.

According to an embodiment, encapsulation (e.g., encapsulation 690) may then be applied to the top surface of the wafer over the transistors and passive devices, in block 1104. Alternatively, encapsulation step 1104 may be excluded.

In block 1106, the wafer is diced along saw streets to singulate the individual die (e.g., die 450) from the wafer. At this point, the die 450 may be considered to be a "packageless" product, which may be directly coupled (e.g., soldered)

to a PCB that includes other portions of the amplifier within which device 400 is to be incorporated.

Alternatively, as is further illustrated in FIGS. 12-15, the die may be packaged. According to an embodiment, packaging essentially includes coupling each singulated die to a leadframe, in block 1108, and encapsulating the assembly, in block 1110. The process of attaching the dies to a leadframe (block 1108) may be performed in a parallel process, according to an embodiment, using a matrix leadframe, strip, or other leadframe structure.

Figure 12:
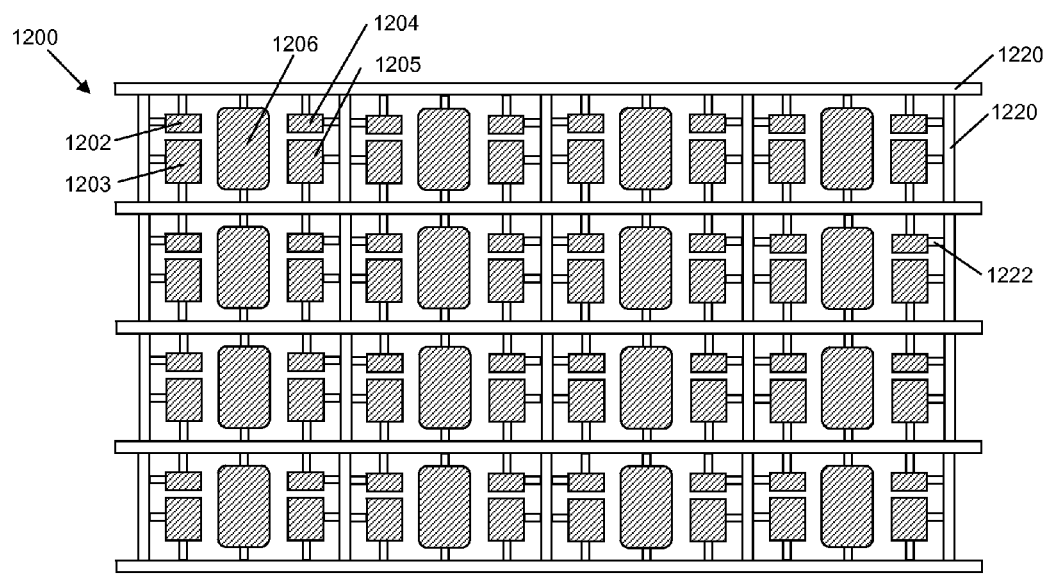
FIGS. 12-16 illustrate various views of an amplifier in the process of manufacturing and packaging the amplifier, and incorporating the amplifier into an amplifier system, in accordance with an example embodiment.
Figure 15:
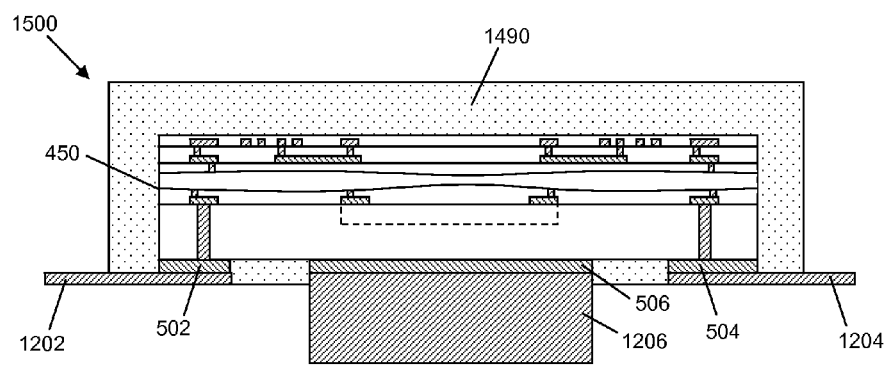

FIG. 12 illustrates a matrix leadframe 1200, which includes a plurality of sets of leadframe features arranged in rows in columns. In an alternate embodiment, the leadframe feature sets may be arranged in a strip (or single row), rather than a matrix. In the illustrated embodiment, each set of leadframe features includes two conductive input-side leads 1202, 1203, two conductive output-side leads 1204, 1205, and a conductive flange 1206 (or heat sink). In alternate embodiments, each set of leadframe features may include more or fewer input and/or output leads, and/or may include additional leads (e.g., for biasing, coupling to external circuitry, and so on). Further, flange 1206 may be excluded, in some embodiments. The leads 1202-1205 and flange 1206 may have similar thicknesses, or they may have different thicknesses. For example, as indicated in FIG. 15, leads 1202-1205 may have a first thickness (e.g., between about 0.15 millimeter (mm) and about 0.25 mm), and flange 1206 may have a second thickness (e.g., between about 0.48 mm and about 1.27 mm), which may better suit flange to function as a heat sink to remove heat from the die 450 during operation.

The various leadframe features 1202-1206 are structurally coupled together by sacrificial rails 1220 and sacrificial connectors 1222. To clearly differentiate the leadframe features 1202-1206 from the sacrificial features 1220, 1222, the leadframe features 1202-1206 are cross-hatched in FIG. 12. In actuality, the leadframe and sacrificial features 1202-1206, 1220, 1222 may be integrally formed from the same material (e.g., a skived or milled leadframe formed from copper or another material), in some embodiments. Alternatively, some or all of the leadframe and sacrificial features 1202-1206, 1220, 1222 may be formed from distinct structures that are otherwise coupled together. For example, the leads 1202-1205 and/or flange 1206 may be distinct structures that are staked to the sacrificial features 1220, 1222.

Figure 13:
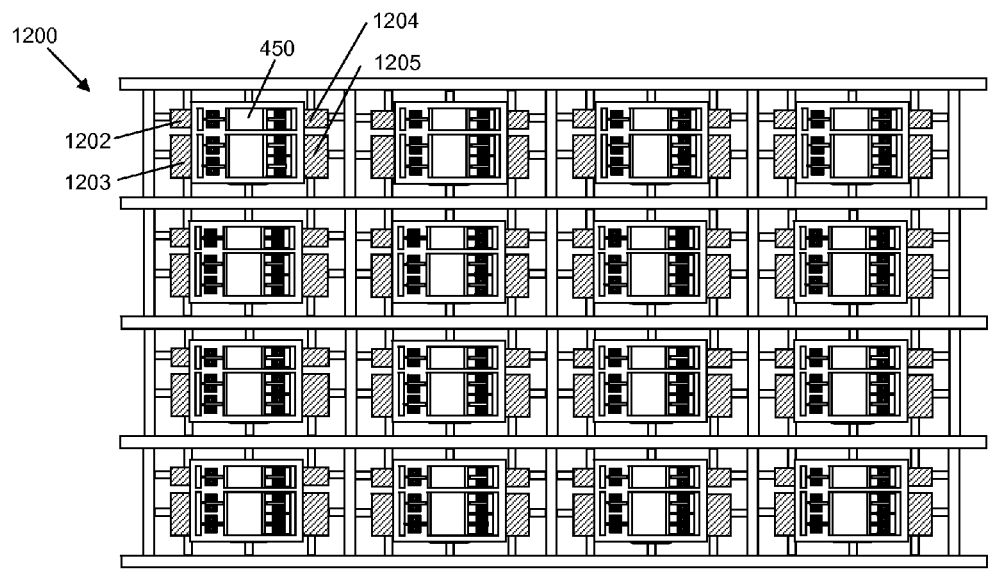

Referring now to FIG. 13, a singulated die 450 may be coupled to each leadframe set in block 1108. More specifically, and as more clearly indicated in the cross-sectional view of FIG. 15, the conductive features 502-506 on the bottom die surface are coupled to corresponding leadframe features 1202-1206. For example, conductive features 502, 503 corresponding to signal inputs for amplifier paths 400, 401 may be coupled to leads 1202, 1203, respectively, conductive features 504, 505 corresponding to signal outputs for amplifier paths 400, 401 may be coupled to leads 1204, 1205, respectively, and voltage reference feature 506 may be coupled to flange 1206, in an embodiment. Coupling of the die 450 to the leadframe features 1202-1206 may be accomplished, for example, using solder, conductive adhesive, brazing, sintering, or other die attach techniques.

Figure 14:
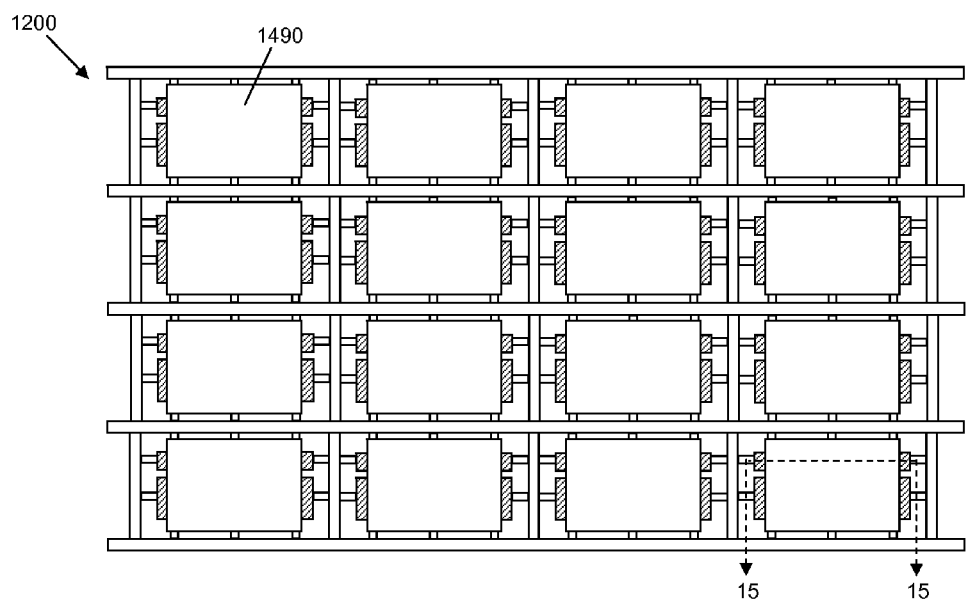

Referring now to FIG. 14, the assembly (i.e., dies 450 and leadframe 1200) may be encapsulated, in block 1110. In various embodiments, encapsulation may utilize transfer molding (including film assisted molding), compression molding, or other techniques. For example, to produce packaged devices with exposed leads (e.g., device 1500, FIG. 15), the assembly may be placed in a mold, and encapsulant material 1490 (e.g., thermoset plastic or resin) may be asserted into mold cavities that correspond to areas in which the encapsulant material 1490 is desired (i.e., areas over the dies 450, under the dies 450, and portions of the leads 1202-1205). Alternatively, to produce "no leads" types of packaged devices (i.e., packaged devices in which the leads do not extend from the sides of the encapsulant material), encapsulant material may be applied over the entire top surface of the assembly.

The devices then may be separated, in block 1110, by removing the sacrificial features 1220, 1222 of the leadframe assembly 1200. For example, FIG. 15 illustrates a cross-sectional side view of a device 1500 (e.g., a cross section along line 15-15 of FIG. 14), which includes a die 450 with attached leads 1202, 1204 and flange 1206, which is encapsulated with encapsulant material 1490.

Figure 16:
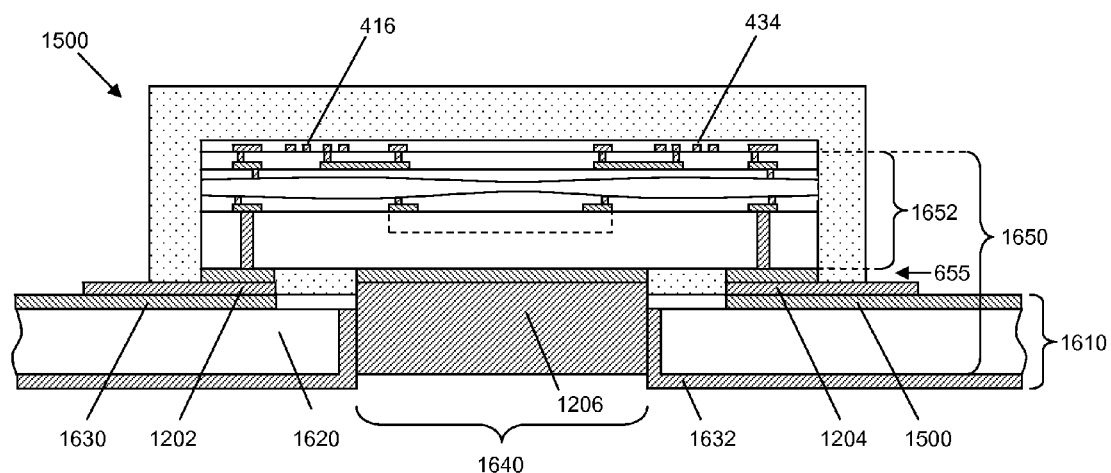

In block 1112, the device 1500 may then be coupled to an electrical system. For example, the electrical system may have additional circuitry configured to provide one or more input RF signals (e.g., to leads 1202, 1203), to receive amplified RF signals produced by the device 1500 (e.g., through leads 1204, 1205), and to provide a voltage reference (e.g., ground, through flange 1206). Referring to FIG. 16, coupling the device 1500 to an electrical system may include, for example, coupling the device 1500 to a PCB 1610, which includes one or more dielectric material layers 1620 (e.g., FR-4 or other PCB dielectrics) and one or more conductive layers 1630, 1632. Although only one dielectric material layer 1620 and two conductive layers 1630, 1632 are shown in FIG. 16, the PCB 1610 may include more than one dielectric material layer, and/or more than two conductive layers. Further, in other embodiments, the device 1500 may be coupled to a substrate other than a PCB.

To electrically and mechanically couple device 1500 to the PCB 1610, each lead 1202-1205 may be soldered or otherwise coupled to corresponding pads or traces formed from a first conductive layer 1630 of the PCB 1610. According to an embodiment, the second conductive layer 1632 of the PCB 1610 may extend into an opening 1640 in the PCB 1610, which is sized to accept the flange 1206. The flange 1206 may be soldered or otherwise coupled to the portions of the second conductive layer 1632 that extend into the opening 1640. In such a manner, the flange 1206 may function both as a heat sink, and as a connection to a voltage reference (e.g., ground), when the second conductive layer 1632 is coupled to the voltage reference. In alternate embodiments, the PCB may include an embedded conductive coin that functions as a heat sink and as a connection to a voltage reference plane. In such an embodiment, flange 1206 may be excluded or may be substantially thinner (e.g., approximately the same thickness as leads 1202-1205.

Importantly, as can be seen in FIG. 16, the vertical distance 1650 between the floating inductors 416, 434 and the voltage reference plane (i.e., conductive layer 1632) is substantially greater than the distance 1652 between the floating inductors 416, 434 and the patterned conductive layer 655 on the bottom surface of die 450. For example, distance 1650 may be in a range of about 5 mils to about 50 mils or more, depending on the cumulative thickness of the die 450, the conductive back metal (e.g., layer 655), the leads (e.g., leads 1202, 1204), and the PCB 1610, where most of the thickness is contributed by the PCB 1610, whereas distance 1652 more typically may be in a range of about 50 microns (2 mils) to about 100 microns (4 mils). In some embodiments, portions of the conductive layer 1632 underlying the inductors 416, 434 could be removed, resulting in the distance 1650 to any virtual ground plane being even further increased.

The lack of a continuous voltage reference plane coupled to the bottom surface of substrate 450 (i.e., the inclusion of conductor-less regions under "floating" inductors 416, 417, 434, 435, according to the various embodiments) may achieve one or more of multiple advantages. First, by excluding the conductive feature 506 underneath inductors 416, 417, 434, 435, the quality factor (Q) of inductors 416, 417, 434, 435 may be significantly increased, when compared with inductors implemented in die that lack the conductor-less regions of the various embodiments (e.g., in die that have a continuous ground plane across its entire bottom surface). In conventional devices, spiral inductor Q is limited by substrate loss, metal loss, and/or capacitive coupling due to close proximity of the voltage reference plane. Accordingly, many RF devices include higher-Q wirebonds to provide inductances, rather than using integrated spiral inductors. However, implementation of the "floating inductors" 416, 417, 434, 435 of the present embodiments overcome limitations of conventional spiral inductors, resulting in inductors with significantly higher Q than conventional integrated inductors.

The higher Q of inductors 416, 417, 434, 435 is achieved in several ways, in the above discussed embodiments. First, and as described previously, the voltage reference plane underlying inductors 416, 417, 434, 435 essentially is "pushed away" (in distance) from inductors 416, 417, 434, 435. Although a voltage reference plane (e.g., a ground plane) may be located on a PCB or other substrate to which device 400 ultimately is coupled (e.g., voltage reference plane 1632 on PCB 1610, FIG. 16), and that voltage reference plane may underlie inductors 416, 417, 434, 435, the distance between the inductors 416, 417, 434, 435 and the voltage reference plane may be made to be significantly greater than the distance that otherwise would be present if conductive feature 506 extended underneath inductors 416, 417, 434, 435, as shown in FIG. 16 and explained above. In addition, as discussed previously, the inclusion of a highly-conductive material (e.g., copper) in at least the portions of the top metal layer (e.g., layer 683) from which inductors 416, 417, 434, 435 are formed may further increase the Q of inductors 416, 417, 434, 435.

Figure 17:
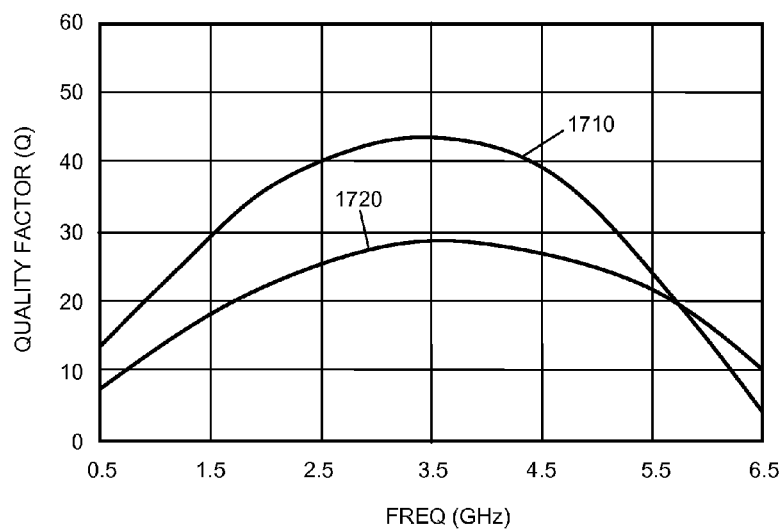
FIG. 17 is a chart illustrating inductor quality (Q) factor with respect to frequency for a conventional inductor and an inductor implemented according to an embodiment.

This combination of features of device 400 results in a significantly higher Q for the inductors 416, 417, 434, 435. For example, FIG. 17 is a chart illustrating inductor Q with respect to frequency for a conventional spiral inductor (e.g., a spiral inductor implemented in a die with a continuous conductive ground plane on its bottom surface) and an inductor implemented according to an embodiment (e.g., one of inductors 416, 417, 434, 435) on a die (e.g., die 450) that is mounted on a PCB (e.g., PCB 1610). More specifically, trace 1710 represents inductor Q with respect to frequency for a spiral inductor that is spaced approximately 75 microns from an underlying ground plane (e.g., a conventional spiral inductor), and trace 1720 represents inductor Q with respect to frequency for a spiral inductor that is spaced approximately 500 microns from an underlying ground plane (e.g., a spiral inductor implemented with an underlying conductor-less region and with the ground plane underlying the inductor comprising a portion of a PCB conductive layer). As the chart indicates, at a frequency of about 3.5 GHz, the conventional inductor has a Q of approximately 28, and an inductor according to an embodiment has a Q of about 43. Given the same spacing between the inductor and the ground plane, the frequency of maximum Q for the inductor is a function of the inductance value. Accordingly, the maximum Q point may be moved to lower or higher frequencies than those depicted in FIG. 17.

As the above description and the example results in FIG. 17 indicate, whereas a conventional integrated inductor with an underlying voltage reference plane coupled to the die may have a Q of 25-35 or less, integrated inductors 416, 417, 434, 435 may achieve a Q of greater than 40 or more (e.g., including Q factors greater than 65), in some embodiments. The features of the various embodiments that result in increased Q may be particularly advantageous when implemented with respect to inductors 434, 435 of the output circuit (e.g., output circuit 130, FIG. 1), because the Q of inductors 434, 435 significantly affects the efficiency of the device 400 and amplifier.

In addition to achieving higher Q inductance, implementation of the various embodiments enabled the inductance density of the device to be increased. Because a spiral inductor essentially is a transmission line, a capacitance component is present between a spiral inductor and a voltage reference plane over which the inductor is positioned. By pushing away the voltage reference plane, the capacitance portion is reduced and the inductance is raised (when compared with an inductor with a closer voltage reference plane).

Further, reduction or elimination of inductors implemented using wirebonds may significantly simplify and reduce the cost of back-end assembly processes. More specifically, the specialized equipment used to attach and shape wirebond arrays to device leads and between device components to achieve desired inductances may be eliminated from the back-end production equipment. Further, elimination of wirebond arrays also eliminates the inductive coupling between those arrays, which otherwise may detrimentally affect performance.

Figure 18:
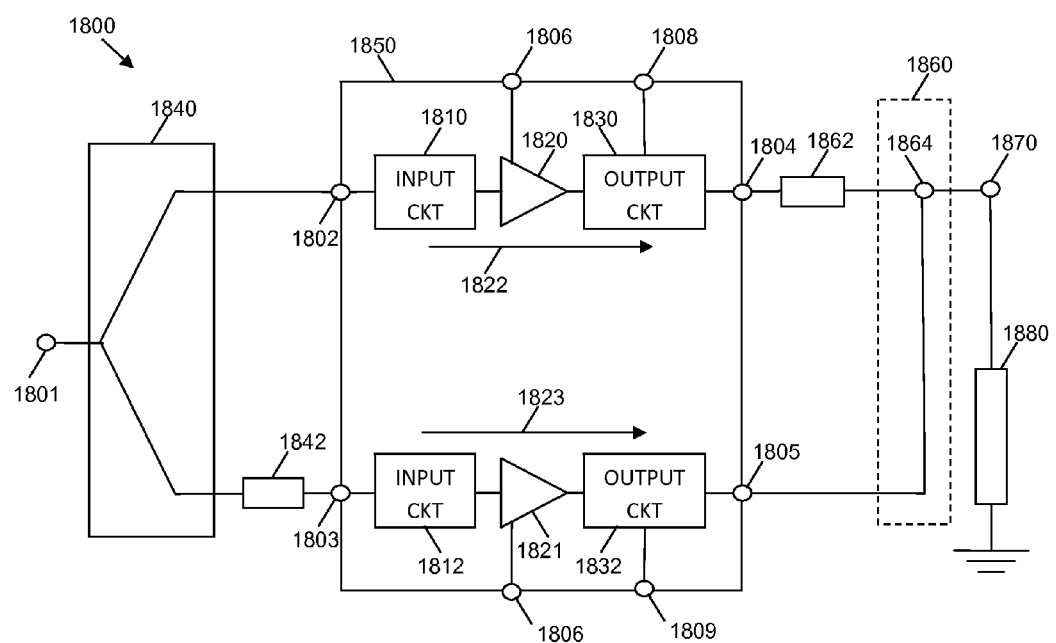
FIG. 18 is a block diagram of a Doherty power amplifier, in accordance with an embodiment.

Embodiments of amplifier die (e.g., die 450 or other die with more or fewer amplifier paths) may be incorporated into any of a variety of different types of amplifier systems, as discussed previously. For example, a two-path die, such as die 450, may be incorporated into a two-way Doherty power amplifier, which includes a main amplifier path and a single peaking amplifier path. Such an embodiment is illustrated in FIG. 18, which is a simplified block diagram of a Doherty power amplifier 1800. Amplifier system 1800 includes an input node 1801, an output node 1870, a power divider 1840, an RF amplifier device 1850 (e.g., die 450 or device 1500), and a power combiner 1860, according to an embodiment. The power divider 1840 is coupled between input node 1801 and input terminals 1802, 1803 to the RF amplifier device 1850, and the power combiner 1860 is coupled between output terminals 1804, 1805 of the RF amplifier device 1850 and output node 1870. An input signal received at input node 1801 is amplified by amplifier system 1800 and provided to a load 1880 (e.g., an antenna) via output node 1870.

More specifically, during operation, the power divider 1840 is configured to divide the power of the input signal received at node 1801 into multiple portions (e.g., equal portions) of the input signal, where respective portions of the input signal are provided to input terminals 1802, 1803. For example, a first output of the power divider 1840 may be coupled to the input terminal 1802 corresponding to the first amplifier path 1822, and a second output of the power divider 1840 may be coupled to the input terminal 1803 corresponding to the second amplifier path 1823. The power divider 1840 may divide the input power equally among the amplifier paths 1822, 1823, such that roughly half of the input signal power is provided to each amplifier path 1822, 1823. Alternatively, the power divider 1840 may divide the power unequally.

The amplifier system 1800 includes a first phase inversion element 1842 between the second output of the power divider 1840 and the input terminal 1803 corresponding to the peaking amplifier path 1823. For example, the first phase inversion element 1842 may be implemented as a quarter wave transmission transformer (e.g., a 90° phase length transmission line) or a lumped element implementation of a 90° phase transformer. Amplifier system 1800 also includes a second phase inversion element 1862 between the output terminal 1804 corresponding to the main amplifier path 1822 and a summing node 1864 of the power combiner 1860. The output terminal 1805 for the peaking amplifier path 1823 also is coupled to the summing node 1864. As with the first phase inversion element 1842, the second phase inversion element 1862 may be implemented as a quarter wave transmission transformer (e.g., a 90° phase length transmission line) or a lumped element implementation of a 90° phase transformer. The combination of phase inversion elements 1842, 1862 ensures that the currents ultimately provided to summing node 1864 by the respective amplifier paths 1822, 1823 are provided substantially in-phase with each other. Accordingly, the current provided by summing node 1864 to output node 1870 (and to load 1880) represents the in-phase summation of the currents provided by amplifier paths 1822, 1823.

In an alternate embodiment, positive and negative phase shifts may be applied along both amplifier paths 1822, 1823 at the inputs of the device 1850 to achieve approximately 90° of phase difference between the signals processed through the device 1850 along the main and peaking amplifier paths 1822, 1823. Similarly, positive and negative phase shifts may be applied along both amplifier paths 1822, 1823 at the outputs of the device 1850 to ensure that the signals are combined in phase at summing node 1864. In another alternate embodiment, the amplifier system may be configured in an "inverted Doherty" configuration. In such a configuration, the input side phase inversion element is included at the input to the main amplifier path (rather than at the input to the peaking amplifier path), and the output side phase inversion element is included at the output of the peaking amplifier path (rather than at the output of the main amplifier path).

The RF amplifier device 1850 includes multiple amplifier paths 1822, 1823 (e.g., amplifier paths 400, 401, FIG. 4). Each amplifier path 1822, 1823 includes an input impedance matching circuit (INPUT CKT) 1810, 1812 (e.g., input circuits 110, 210, 310), one or more amplifier stages 1820, 1821 (e.g., transistors 120, 420, 421), and an output impedance matching circuit (OUTPUT CKT) 1830, 1832 (e.g., output circuits 130, 230, 330) coupled in series between input terminals 1802, 1803 (e.g., conductive features 502, 503 and/or leads 1202, 1203) and output terminals 1804, 1805 (e.g., conductive features 504, 505 and/or leads 1204, 1205) of the device 1850. In addition, each amplifier stage 1820, 1821 may be coupled to a voltage reference plane (e.g., ground) through terminals 1806 (e.g., conductive feature 506 and/or flange 1206).

Each of the input impedance matching circuits 1810, 1812 is configured to provide a desired input impedance at its respective input terminal 1802, 1803 at the fundamental frequency (or carrier frequency) of the amplifier system 1800. As discussed previously, each input impedance matching circuit 1810, 1812 may be implemented as a low pass filter circuit (e.g., input circuit 110, FIG. 1), a high pass filter circuit (e.g., input circuit 210, FIG. 2), or a bandpass filter circuit (e.g., input circuit 310, FIG. 3), which may include various configurations of inductors and capacitors (e.g., inductors 116, 216, 316, 317, 416, 417 and capacitors 114, 214, 314, 315, 414, 415).

According to various embodiments, Doherty amplifier 1800 may be a symmetrical Doherty amplifier or an asymmetrical Doherty amplifier. Accordingly, the amplifier stages 1820, 1821 may be symmetrical (i.e., substantially the same size) or asymmetrical (i.e., of different sizes, as illustrated in FIG. 4). In the Doherty configuration, amplifier stage 1820 may be configured and operated as a main amplifier, and amplifier stage 1821 may be configured as and operated as a peaking amplifier. The main amplifier stage 1820 is configured as a Class AB amplifier, meaning that the transistor arrangement of main amplifier stage 1820 is biased to provide a conduction angle between 180 and 360 degrees. Conversely, the peaking amplifier stage 1821 is realized as a transistor arrangement configured as a Class C amplifier, meaning that the transistor arrangement of the peaking amplifier stage 1821 is biased to provide a conduction angle less than 180 degrees. For example, bias voltages may be provided to the main and peaking amplifier stages 1820, 1821 (e.g., to RF cold points 442, 443) through terminals 1808, 1809 (e.g., through conductive features 508, 509), each of which may coupled to an appropriate bias voltage. Alternatively, the peaking amplifier stage 1821 may be connected (e.g., through conductive feature 509) to external control circuitry that dynamically adjusts the peaking amplifier's operating mode between Class AB and Class C at the RF signal's envelope rate depending on instantaneous output power requirements. The main and peaking amplifier stages 1820, 1821 also may be coupled to other circuitry through terminals 1808, 1809 (e.g., envelope frequency termination circuitry or other circuitry).

Each of the output impedance matching circuits 1830, 1832 is configured to provide a desired output impedance at its respective output terminal 1804, 1805 at the fundamental frequency of the amplifier system 1800. In an exemplary embodiment, the amplifier system 1800 is used to transmit RF signals, and the fundamental frequency (or carrier frequency) is the frequency of transmittance. As discussed previously, each output impedance matching circuit 1830, 1832 may be implemented as a high pass filter circuit (e.g., output circuit 130, FIG. 1), a low pass filter circuit (e.g., output circuit 230, FIG. 2), or a bandpass filter circuit (e.g., output circuit 330, FIG. 3), which may include various configurations of inductors and capacitors (e.g., inductors 134, 234, 334, 335, 434, 435 and capacitors 132, 232, 332, 333, 432, 433).

According to an embodiment, the input impedance matching circuits 1810, 1812 are substantially identical to each other (e.g., low pass, high pass, or bandpass circuits), and the output impedance matching circuits 1830, 1832 also are substantially identical to each other (e.g., high pass, low pass, or bandpass circuits). In other embodiments, the input impedance matching circuits 1810, 1812 may be different from each other, and/or the output impedance matching circuits 1830, 1832 may be different from each other. It should be noted that the subject matter described herein is not intended to be limited to any particular configuration and/or circuit topology for the input impedance matching circuits 1810, 1812 and the output impedance matching circuits 1830, 1832.

According to an embodiment, the multiple amplifier paths 1822, 1823 all are contained in a single integrated circuit die (e.g., die 450) with the input and output terminals 1802-1805 providing external electronic connectivity to the device 1850. More specifically, the input and output terminals 1802, 1803, 1804, 1805 generally represent the package leads, pins, or other physical interfaces for creating electrical connections to the internal components (e.g., amplifier paths 1822, 1823) of the RF amplifier device 1850. Referring to the previously described embodiments, for example, input terminals 1802, 1803 may correspond to input leads 202, 702, 703, 802, and output terminals 1804, 1805 may correspond to output leads 204, 704, 705, 804, 805.

According to an embodiment, the components (e.g., inductor, capacitors, resistors, and other components) of each input impedance matching circuit 1810, 1812 and each output impedance matching circuit 1830, 1832 may be implemented in on the same die as amplifier stages 1820, 1821 (e.g., on die 450). Alternatively, one or more components of each input and/or output impedance matching circuit may be implemented on a separate die (e.g., an integrated passive device die) or as a discrete component or set of wirebonds. In still other alternate embodiments, some or all of the components of amplifier path 1822 may be implemented on one die, and some or all of the components of amplifier path 1823 may be implemented on another distinct die. Further, an amplifier may include as few as one amplifier path, or an amplifier (including a Doherty amplifier) may include more than two amplifier paths, in various embodiments. In a multi-path amplifier, the amplifier paths may be implemented on a single die or on multiple die, in various embodiments. Finally, although single-stage amplifier paths 1822, 1823 are shown in FIG. 18, embodiments may be implemented using multi-stage amplifier paths, as well.

It should be understood that FIG. 18 is a simplified representation of an amplifier system 1800 for purposes of explanation and ease of description, and that practical embodiments may include other devices and components to provide additional functions and features, and/or the amplifier system 1800 may be part of a much larger electrical system, as will be understood. For example, as implied previously, embodiments of devices discussed herein may be incorporated into amplifiers having a single amplification path or more than two amplification paths, as well as amplifiers having configurations other than Doherty configurations.

An embodiment of an amplifier includes a semiconductor substrate having a top substrate surface and a bottom substrate surface. A conductive feature is coupled to the bottom substrate surface. The conductive feature only partially covers the bottom substrate surface to define a conductor-less region that spans a portion of the bottom substrate surface. A transistor is formed at the top substrate surface. The transistor includes a control terminal, a first current conducting terminal, and a second current conducting terminal. The first current conducting terminal is electrically coupled to the conductive feature. A filter circuit is electrically coupled to the second current conducting terminal. The filter circuit includes an inductor formed over a portion of the top substrate surface that is directly opposite the conductor-less region. According to a further embodiment, the inductor is a spiral inductor comprising portions of one or more conductive layers formed over the top substrate surface.

Another embodiment of an amplifier includes a monolithic active circuit that includes a semiconductor substrate having a top substrate surface and a bottom substrate surface. A first conductive feature is coupled to a first region of the bottom substrate surface. The first conductive feature only partially covers the bottom substrate surface. A second conductive feature is coupled to a second region of the bottom substrate surface that is separated from the first region by a first conductor-less region spanning a first portion of the bottom substrate surface. A transistor is formed at the top substrate surface. The transistor includes a control terminal, a first current conducting terminal, and a second current conducting terminal. The first current conducting terminal is electrically coupled to the first conductive feature, and the second current conducting terminal is electrically coupled to the second conductive feature. A first filter circuit is electrically coupled to the second current conducting terminal. The first filter circuit includes an inductor formed over a portion of the top substrate surface that is directly opposite the first conductor-less region. A first conductive lead is coupled to the second conductive feature.

According to a further embodiment, the monolithic active circuit also includes a third conductive feature that is physically separated from the first conductive feature across a second conductor-less region spanning a second portion of the bottom substrate surface, and a second filter circuit electrically coupled to the control terminal and to the third conductive feature. The amplifier further comprises a second conductive lead coupled to the third conductive feature.

An embodiment of a method of forming an amplifier includes forming a transistor at a top substrate surface of a semiconductor substrate. The first transistor includes a control terminal, a first current conducting terminal, and a second current conducting terminal. The method further includes electrically coupling a first filter circuit to the second current conducting terminal. The first filter circuit includes an inductor formed over a portion of the top substrate surface. The method further includes coupling a first conductive feature to a bottom substrate surface of the semiconductor substrate. The first conductive feature only partially covers the bottom substrate surface to define a first conductor-less region that spans a first portion of the bottom substrate surface that underlies the inductor. The first conductive feature is electrically coupled to the first current conducting terminal. According to a further embodiment, electrically coupling the first filter circuit includes forming the inductor over the portion of the top substrate surface as a spiral inductor comprising portions of one or more conductive layers formed over the top substrate surface.

According to a further embodiment, the method also includes coupling a second conductive feature to the bottom substrate surface. The second conductive feature is electrically coupled to the first filter circuit and to the second current conducting terminal, and the second conductive feature is physically separated from the first conductive feature by the first conductor-less region. According to a further embodiment, the method also includes electrically coupling a second filter circuit to the control terminal, and coupling a third conductive feature to the bottom substrate surface. The third conductive feature is electrically coupled to the second filter circuit and to the control terminal, and the third conductive feature is physically separated from the first conductive feature by a second conductor-less region. According to another further embodiment, the method also includes coupling a first conductive lead to the second conductive feature, and coupling a second conductive lead to the first conductive feature. According to a further embodiment, the method also includes encapsulating the semiconductor substrate and the first and second conductive leads. According to another further embodiment, the first and second conductive leads comprise a first set of leads of a matrix leadframe that includes a plurality of additional sets of leads, and the method further includes coupling a plurality of additional semiconductor substrates, each with a monolithic amplifier circuit, to the plurality of additional sets of leads. Encapsulating further comprises encapsulating the additional semiconductor substrates and the additional sets of leads, and the method also includes removing sacrificial features of the matrix leadframe to form a plurality of amplifier devices.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier comprising:
    a semiconductor substrate having a top substrate surface and a bottom substrate surface;
    a first conductive feature coupled to the bottom substrate surface, wherein the first conductive feature only partially covers the bottom substrate surface to define a first conductor-less region that spans a first portion of the bottom substrate surface;
    a first transistor formed at the top substrate surface, wherein the first transistor includes a first control terminal, a first current conducting terminal connected to a first current conducting region within the semiconductor substrate, and a second current conducting terminal connected to a second current region within the semiconductor substrate, wherein the first current conducting terminal is electrically coupled to the first conductive feature; and
    a first filter circuit electrically coupled to the second current conducting terminal, wherein the first filter circuit includes a first inductor formed over a portion of the top substrate surface that is directly opposite the first conductor-less region.

2. The amplifier of claim 1, wherein the first inductor is a spiral inductor comprising portions of one or more conductive layers formed over the top substrate surface.

3. The amplifier of claim 1, wherein the first filter circuit is selected from a low pass filter circuit, a high pass filter circuit, and a band pass filter circuit.

4. The amplifier of claim 1, further comprising:
    a second conductive feature coupled to the bottom substrate surface and physically separated from the first conductive feature across the first conductor-less region, wherein the second current conducting terminal is electrically coupled to the second conductive feature.

5. An amplifier comprising:
    a semiconductor substrate having a top substrate surface and a bottom substrate surface;
    a first conductive feature coupled to the bottom substrate surface, wherein the first conductive feature only partially covers the bottom substrate surface to define a first conductor-less region that spans a first portion of the bottom substrate surface;
    a first transistor formed at the top substrate surface, wherein the first transistor includes a first control terminal, a first current conducting terminal, and a second current conducting terminal, wherein the first current conducting terminal is electrically coupled to the first conductive feature;
    a first filter circuit electrically coupled to the second current conducting terminal, wherein the first filter circuit includes a first inductor formed over a portion of the top substrate surface that is directly opposite the first conductor-less region; and
    a second conductive feature coupled to the bottom substrate surface and physically separated from the first conductive feature across the first conductor-less region, wherein the second current conducting terminal is electrically coupled to the second conductive feature, wherein the second current conducting terminal is electrically coupled to the second conductive feature with at least one conductive structure selected from a through substrate via (TSV) and a wrap-around termination.

6. The amplifier of claim 4, wherein:
    the first inductor has first and second inductor terminals,
    the first inductor terminal is electrically coupled to the second current conducting terminal and to the second conductive feature, the first filter circuit further includes a capacitor with first and second capacitor plates, the first capacitor plate is electrically coupled to the second inductor terminal at a radio frequency (RF) cold point node, and the second capacitor plate is electrically coupled to the first conductive feature.

7. The amplifier of claim 6, further comprising:
a third conductive feature coupled to the bottom substrate surface and physically separated from the first and second conductive features across the bottom substrate surface, wherein the RF cold point node is electrically coupled to the third conductive feature.

8. The amplifier of claim 7, wherein:
the RF cold point node is electrically coupled to the third conductive feature through at least one first TSV that extends between the top and bottom substrate surfaces, and the second capacitor plate is electrically coupled to the first conductive feature through at least one second TSV that extends between the top and bottom substrate surfaces.

9. The amplifier of claim 6, wherein the first and second capacitor plates comprise portions of first and second conductive layers formed over the top substrate surface.

10. An amplifier comprising:
a semiconductor substrate having a top substrate surface and a bottom substrate surface;
a first conductive feature coupled to the bottom substrate surface, wherein the first conductive feature only partially covers the bottom substrate surface to define a first conductor-less region that spans a first portion of the bottom substrate surface;
a first transistor formed at the top substrate surface, wherein the first transistor includes a first control terminal, a first current conducting terminal, and a second current conducting terminal, wherein the first current conducting terminal is electrically coupled to the first conductive feature;
a first filter circuit electrically coupled to the second current conducting terminal, wherein the first filter circuit includes a first inductor formed over a portion of the top substrate surface that is directly opposite the first conductor-less region;
a second conductive feature coupled to the bottom substrate surface and physically separated from the first conductive feature across the first conductor-less region, wherein the second current conducting terminal is electrically coupled to the second conductive feature;
a third conductive feature that is physically separated from the first conductive feature across a second conductor-less region spanning a second portion of the bottom substrate surface; and
a second filter circuit electrically coupled to the first control terminal and to the third conductive feature.

11. The amplifier of claim 10, wherein the second filter circuit includes a second inductor formed over a portion of the top substrate surface is directly opposite the second conductor-less region.

12. The amplifier of claim 10, further comprising:
a first conductive lead coupled to the second conductive feature; and
a second conductive lead coupled to the third conductive feature.

13. The amplifier of claim 10, wherein the second filter circuit is selected from a low pass filter circuit, a high pass filter circuit, and a band pass filter circuit.

14. An amplifier comprising:
a semiconductor substrate having a top substrate surface and a bottom substrate surface;
a first conductive feature coupled to the bottom substrate surface, wherein the first conductive feature only partially covers the bottom substrate surface to define a first conductor-less region that spans a first portion of the bottom substrate surface;
a first transistor formed at the top substrate surface, wherein the first transistor includes a first control terminal, a first current conducting terminal, and a second current conducting terminal, wherein the first current conducting terminal is electrically coupled to the first conductive feature;
a first filter circuit electrically coupled to the second current conducting terminal, wherein the first filter circuit includes a first inductor formed over a portion of the top substrate surface that is directly opposite the first conductor-less region; and
a second conductive feature coupled to the bottom substrate surface and physically separated from the first conductive feature across the first conductor-less region, wherein the second current conducting terminal is electrically coupled to the second conductive feature, wherein
the first current conducting terminal is electrically coupled to the first conductive feature through at least one first TSV that extends between the top and bottom substrate surfaces, and
the second current conducting terminal is electrically coupled to the second conductive feature through at least one second TSV that extends between the top and bottom substrate surfaces.

15. The amplifier of claim 4, wherein:
the first and second conductive features form portions of a patterned conductive layer coupled to the bottom substrate surface, and
the patterned conductive layer has a thickness in a range of 10 microns to 50 microns.

16. The amplifier of claim 4, further comprising:
a second transistor formed in and over the semiconductor substrate, wherein the second transistor includes a second control terminal, a third current conducting terminal, and a fourth current conducting terminal;
a third conductive feature coupled to the bottom substrate surface and physically separated from the first and second conductive features across a second conductor-less region spanning a second portion of the bottom substrate surface; and
a second filter circuit electrically coupled to the third current conducting terminal, wherein the second filter circuit includes a second inductor formed over a portion of the top substrate surface that is directly opposite the second conductor-less region.

17. The amplifier of claim 1, further comprising:
a second transistor formed in and over the semiconductor substrate, wherein the second transistor includes a second control terminal, a third current conducting terminal, and a fourth current conducting terminal, and wherein the third current conducting terminal is electrically coupled to the first conductive feature; and
a second filter circuit electrically coupled to the fourth current conducting terminal, wherein the second filter circuit includes a second inductor formed over a second portion of the top substrate surface that is directly opposite the first conductor-less region.

18. The amplifier of claim 1, wherein the semiconductor substrate is a high resistivity substrate.

19. The amplifier of claim 1, further comprising: encapsulant formed over the top substrate surface.

20. An amplifier comprising:
a monolithic active circuit that includes
a semiconductor substrate having a top substrate surface and a bottom substrate surface,
a first conductive feature coupled to a first region of the bottom substrate surface, wherein the first conductive feature only partially covers the bottom substrate surface,
a second conductive feature coupled to a second region of the bottom substrate surface that is separated from the first region by a first conductor-less region spanning a first portion of the bottom substrate surface,
a transistor formed at the top substrate surface, wherein the transistor includes a control terminal, a first current conducting region within the semiconductor substrate, a first current conducting terminal coupled to the first current conducting region, a second current conducting region within the semiconductor substrate, and a second current conducting terminal coupled to the second current conducting region, wherein the first current conducting terminal is electrically coupled to the first conductive feature, and wherein the second current conducting terminal is electrically coupled to the second conductive feature, and
a first filter circuit electrically coupled to the second current conducting terminal, wherein the first filter circuit includes an inductor formed over a portion of the top substrate surface that is directly opposite the first conductor-less region; and
a first conductive lead coupled to the second conductive feature.

21. An amplifier comprising:
a monolithic active circuit that includes
a semiconductor substrate having a top substrate surface and a bottom substrate surface,
a first conductive feature coupled to a first region of the bottom substrate surface, wherein the first conductive feature only partially covers the bottom substrate surface,
a second conductive feature coupled to a second region of the bottom substrate surface that is separated from the first region by a first conductor-less region spanning a first portion of the bottom substrate surface,
a transistor formed at the top substrate surface, wherein the transistor includes a control terminal, a first current conducting terminal, and a second current conducting terminal, wherein the first current conducting terminal is electrically coupled to the first conductive feature, and wherein the second current conducting terminal is electrically coupled to the second conductive feature, and
a first filter circuit electrically coupled to the second current conducting terminal, wherein the first filter circuit includes an inductor formed over a portion of the top substrate surface that is directly opposite the first conductor-less region,
a third conductive feature that is physically separated from the first conductive feature across a second conductor-less region spanning a second portion of the bottom substrate surface, and
a second filter circuit electrically coupled to the control terminal and to the third conductive feature;
a first conductive lead coupled to the second conductive feature; and
a second conductive lead coupled to the third conductive feature.

22. The amplifier of claim 21, further comprising:
a printed circuit board that includes a first conductive trace coupled to the second conductive feature, and a second conductive trace coupled to the third conductive feature.

23. The amplifier of claim 21, further comprising:
a conductive flange coupled to the first conductive feature.

24. The amplifier of claim 20, wherein the first inductor includes a spiral inductor comprising portions of one or more conductive layers formed over the top substrate surface.

25. The amplifier of claim 20, wherein:
the inductor has first and second inductor terminals,
the first inductor terminal is electrically coupled to the second current conducting terminal and to the second conductive feature,
the first filter circuit further includes a capacitor with first and second capacitor plates,
the first capacitor plate is electrically coupled to the second inductor terminal, and
the second capacitor plate is electrically coupled to the first conductive feature.

26. A method of forming an amplifier, the method comprising the steps of:
forming a transistor at a top substrate surface of a semiconductor substrate, wherein the first transistor includes a control terminal, a first current conducting region within the semiconductor substrate, a first current conducting terminal coupled to the first current conducting region, a second current conducting region within the semiconductor substrate, and a second current conducting terminal coupled to the second current conducting region;
electrically coupling a first filter circuit to the second current conducting terminal, wherein the first filter circuit includes an inductor formed over a portion of the top substrate surface; and
coupling a first conductive feature to a bottom substrate surface of the semiconductor substrate, wherein the first conductive feature only partially covers the bottom substrate surface to define a first conductor-less region that spans a first portion of the bottom substrate surface that underlies the inductor, and wherein the first conductive feature is electrically coupled to the first current conducting terminal.

27. The method of claim 26, wherein electrically coupling the first filter circuit comprises:
forming the inductor over the portion of the top substrate surface as a spiral inductor comprising portions of one or more conductive layers formed over the top substrate surface.

28. The method of claim 26, further comprising:
coupling a second conductive feature to the bottom substrate surface, wherein the second conductive feature is electrically coupled to the first filter circuit and to the second current conducting terminal, and the second conductive feature is physically separated from the first conductive feature by the first conductor-less region.

29. A method of forming an amplifier, the method comprising the steps of:
forming a transistor at a top substrate surface of a semiconductor substrate, wherein the first transistor includes a control terminal, a first current conducting terminal, and a second current conducting terminal;

electrically coupling a first filter circuit to the second current conducting terminal, wherein the first filter circuit includes an inductor formed over a portion of the top substrate surface;

coupling a first conductive feature to a bottom substrate surface of the semiconductor substrate, wherein the first conductive feature only partially covers the bottom substrate surface to define a first conductor-less region that spans a first portion of the bottom substrate surface that underlies the inductor, and wherein the first conductive feature is electrically coupled to the first current conducting terminal;

coupling a second conductive feature to the bottom substrate surface, wherein the second conductive feature is electrically coupled to the first filter circuit and to the second current conducting terminal, and the second conductive feature is physically separated from the first conductive feature by the first conductor-less region;

electrically coupling a second filter circuit to the control terminal; and coupling a third conductive feature to the bottom substrate surface, wherein the third conductive feature is electrically coupled to the second filter circuit and to the control terminal, and the third conductive feature is physically separated from the first conductive feature by a second conductor-less region.

electrically coupling a second filter circuit to the control terminal; and coupling a third conductive feature to the bottom substrate surface, wherein the third conductive feature is electrically coupled to the second filter circuit and to the control terminal, and the third conductive feature is physically separated from the first conductive feature by a second conductor-less region.

30. The method of claim 29, further comprising:
coupling a first conductive lead to the second conductive feature; and
coupling a second conductive lead to the first conductive feature.

31. The method of claim 30, further comprising:
encapsulating the semiconductor substrate and the first and second conductive leads.

32. The method of claim 31, wherein:
the first and second conductive leads comprise a first set of leads of a matrix leadframe that includes a plurality of additional sets of leads;
the method further comprises coupling a plurality of additional semiconductor substrates, each with a monolithic amplifier circuit, to the plurality of additional sets of leads;
encapsulating further comprises encapsulating the additional semiconductor substrates and the additional sets of leads; and
the method further comprises removing sacrificial features of the matrix leadframe to form a plurality of amplifier devices.

33. The method of claim 30, further comprising:
electrically coupling the first conductive lead to a first conductive trace on a surface of a printed circuit board; and
electrically coupling the second conductive lead to a second conductive trace on the surface of the printed circuit board.

* * * * *